United States Patent
Kim et al.

(10) Patent No.: US 10,490,770 B2
(45) Date of Patent: Nov. 26, 2019

(54) DISPLAY DEVICE AND METHOD OF MANUFACTURING ELECTRONIC DEVICE USING THE SAME

(71) Applicant: Samsung Display Co., Ltd., Yongin-si, Gyeonggi-do (KR)

(72) Inventors: Minki Kim, Hwaseong-si (KR); Taesoo Kim, Anseong-si (KR); Min-seop Kim, Cheonan-si (KR); Younhwan Jung, Hwaseong-si (KR); Yunoh Nam, Hwaseong-si (KR); Kijong Kim, Eumseong-gun (KR); Younggu Kim, Hwaseong-si (KR); Kyuhan Bae, Ansan-si (KR); Jaelok Cha, Hwaseong-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 15/699,242

(22) Filed: Sep. 8, 2017

(65) Prior Publication Data
US 2018/0076412 A1    Mar. 15, 2018

(30) Foreign Application Priority Data

Sep. 9, 2016 (KR) .................. 10-2016-0116558
May 30, 2017 (KR) .................. 10-2017-0067066

(51) Int. Cl.
*H01L 51/56* (2006.01)
*H01L 51/52* (2006.01)
(Continued)

(52) U.S. Cl.
CPC ........ *H01L 51/5237* (2013.01); *G06F 1/1637* (2013.01); *H01L 21/02304* (2013.01);
(Continued)

(58) Field of Classification Search
CPC ........... H01L 51/5237; H01L 21/02304; H01L 51/56; G06F 1/1637; H04M 1/0266
See application file for complete search history.

(56) References Cited

U.S. PATENT DOCUMENTS

| 7,495,895 B2 * | 2/2009 | Carnevali | ............. G06F 1/1626 |
| | | | 361/679.26 |
| 8,767,384 B2 * | 7/2014 | Song | ................. G02F 1/133308 |
| | | | 361/679.26 |

(Continued)

FOREIGN PATENT DOCUMENTS

| KR | 10-2014-0108826 A | 9/2014 |
| KR | 10-2014-0112232 A | 9/2014 |

(Continued)

OTHER PUBLICATIONS

EPO Extended Search Report dated Jan. 25, 2018, for corresponding European Patent Application No. 17190033.5 (7 pages).

*Primary Examiner* — Allen L Parker
*Assistant Examiner* — Charles N Ausar-El
(74) *Attorney, Agent, or Firm* — Lewis Roca Rothgerber Christie LLP

(57) ABSTRACT

A display device includes a window member, a display module, a protective cover, and a coupling structure. The display module includes a non-bending area on a rear surface of the window member and a bending area bent from the non-bending area. The protective cover is on a rear surface of the display module to cover the bending area of the display module. The coupling structure couples the display module to the protective cover. The display module is coupled to other components of an electronic device after the protective cover is detached from the display module.

20 Claims, 26 Drawing Sheets

(51) Int. Cl.
*H01L 21/02* (2006.01)
*G06F 1/16* (2006.01)
*H04M 1/02* (2006.01)
*H01L 21/8234* (2006.01)

(52) U.S. Cl.
CPC .......... *H01L 51/56* (2013.01); *H04M 1/0266* (2013.01); *H01L 21/022* (2013.01); *H01L 21/823462* (2013.01); *H04M 1/0277* (2013.01)

(56) References Cited

U.S. PATENT DOCUMENTS

| | | | | |
|---|---|---|---|---|
| 8,827,536 | B2* | 9/2014 | Lee | H05K 5/0017 362/249.04 |
| 8,872,997 | B2* | 10/2014 | Rothkopf | H04M 1/0266 349/58 |
| 9,104,368 | B2* | 8/2015 | Ka | G06F 1/1601 |
| 9,110,320 | B2* | 8/2015 | Chen | G06F 3/0412 |
| 9,287,342 | B2 | 3/2016 | Kwon et al. | |
| 9,419,065 | B2 | 8/2016 | Degner et al. | |
| 9,526,166 | B2* | 12/2016 | Jin | H04M 1/0266 |
| 9,530,831 | B2* | 12/2016 | Lee | H01L 51/0097 |
| 9,674,961 | B2* | 6/2017 | Ahn | H05K 1/189 |
| 9,697,764 | B2* | 7/2017 | Kim | H01L 51/52 |
| 9,699,943 | B2* | 7/2017 | Bae | G06F 1/1637 |
| 9,747,819 | B2* | 8/2017 | Ye | G09F 13/0409 |
| 9,818,974 | B2* | 11/2017 | Kwon | H01L 27/323 |
| 9,941,337 | B2* | 4/2018 | Kwon | H01L 27/3248 |
| 2009/0019401 | A1* | 1/2009 | Park | G06F 3/04883 715/841 |
| 2009/0066663 | A1* | 3/2009 | Chang | G06F 1/1615 345/173 |
| 2009/0174995 | A1* | 7/2009 | Prest | H05K 5/0017 361/679.21 |
| 2009/0219247 | A1* | 9/2009 | Watanabe | G06F 1/1615 345/157 |
| 2009/0257181 | A1* | 10/2009 | Ha | H01L 51/5237 361/679.26 |
| 2009/0290319 | A1* | 11/2009 | Myers | H05K 9/0032 361/818 |
| 2010/0026952 | A1* | 2/2010 | Miura | G02F 1/133305 349/150 |
| 2010/0246113 | A1* | 9/2010 | Visser | G06F 1/1601 361/679.3 |
| 2010/0293782 | A1* | 11/2010 | Yamazaki | H01L 51/0097 29/825 |
| 2011/0007042 | A1* | 1/2011 | Miyaguchi | G02F 1/133305 345/204 |
| 2011/0187681 | A1* | 8/2011 | Kim | G06F 1/1652 345/204 |
| 2012/0044620 | A1* | 2/2012 | Song | G06F 1/1616 361/679.01 |
| 2012/0242588 | A1* | 9/2012 | Myers | G06F 1/1637 345/173 |
| 2012/0287066 | A1* | 11/2012 | Yang | G06F 1/1626 345/173 |
| 2012/0329528 | A1* | 12/2012 | Song | H04M 1/0268 455/566 |
| 2013/0002133 | A1* | 1/2013 | Jin | H01L 51/524 313/511 |
| 2013/0002572 | A1* | 1/2013 | Jin | G02F 1/133305 345/173 |
| 2013/0002583 | A1* | 1/2013 | Jin | G06F 1/1637 345/173 |
| 2013/0033434 | A1* | 2/2013 | Richardson | G06F 3/0488 345/173 |
| 2013/0044215 | A1* | 2/2013 | Rothkopf | G06F 1/163 348/143 |
| 2013/0063891 | A1* | 3/2013 | Martisauskas | G06F 1/1643 361/679.56 |
| 2013/0083491 | A1* | 4/2013 | Rappoport | G06F 1/1656 361/722 |
| 2013/0083496 | A1* | 4/2013 | Franklin | G06F 1/1626 361/749 |
| 2013/0094126 | A1* | 4/2013 | Rappoport | G02B 27/01 361/679.01 |
| 2013/0145311 | A1* | 6/2013 | Joo | G06F 3/04886 715/788 |
| 2013/0154971 | A1* | 6/2013 | Kang | G06F 3/0414 345/173 |
| 2013/0201093 | A1* | 8/2013 | Kim | G06F 3/033 345/156 |
| 2013/0201575 | A1* | 8/2013 | Cheon | F21V 11/00 359/893 |
| 2013/0222289 | A1* | 8/2013 | Kwak | G06F 3/041 345/173 |
| 2013/0222293 | A1* | 8/2013 | Chung | G06F 3/041 345/173 |
| 2013/0222349 | A1* | 8/2013 | Baek | G06F 15/0241 345/204 |
| 2013/0234951 | A1* | 9/2013 | Kim | G06F 1/1652 345/173 |
| 2013/0293816 | A1* | 11/2013 | Jung | H01L 23/49827 349/139 |
| 2013/0300697 | A1* | 11/2013 | Kim | G06F 1/1626 345/173 |
| 2013/0321373 | A1* | 12/2013 | Yoshizumi | G09G 5/00 345/211 |
| 2013/0321740 | A1* | 12/2013 | An | H05K 5/0217 349/58 |
| 2013/0329422 | A1* | 12/2013 | Park | G02F 1/133305 362/233 |
| 2014/0002385 | A1* | 1/2014 | Ka | G06F 1/1601 345/173 |
| 2014/0002973 | A1* | 1/2014 | Lee | H05K 7/00 361/679.01 |
| 2014/0004906 | A1* | 1/2014 | Chi | H04B 1/38 455/566 |
| 2014/0062892 | A1* | 3/2014 | Dickinson | G06F 3/0412 345/173 |
| 2014/0078046 | A1* | 3/2014 | Seo | G06F 1/1652 345/156 |
| 2014/0098075 | A1* | 4/2014 | Kwak | G06F 3/0487 345/204 |
| 2014/0098549 | A1* | 4/2014 | Hack | G02F 1/133305 362/418 |
| 2014/0104202 | A1* | 4/2014 | Choi | H05K 5/0017 345/173 |
| 2014/0104762 | A1* | 4/2014 | Park | G06F 1/1652 361/679.01 |
| 2014/0111549 | A1* | 4/2014 | Vanska | G06F 1/1626 345/656 |
| 2014/0111736 | A1* | 4/2014 | An | G02F 1/133305 349/58 |
| 2014/0132488 | A1* | 5/2014 | Kim | H01L 51/52 345/76 |
| 2014/0198036 | A1* | 7/2014 | Kim | G06F 1/1652 345/156 |
| 2014/0204037 | A1* | 7/2014 | Kim | G06F 1/1647 345/173 |
| 2014/0226275 | A1* | 8/2014 | Ko | G06F 1/1626 361/679.27 |
| 2014/0267091 | A1* | 9/2014 | Kim | G06F 1/1652 345/173 |
| 2014/0268595 | A1 | 9/2014 | Eom et al. | |
| 2014/0306908 | A1* | 10/2014 | Nagaraju | G06F 3/0416 345/173 |
| 2014/0306985 | A1* | 10/2014 | Jeong | G09G 3/3233 345/601 |
| 2014/0340855 | A1* | 11/2014 | Lee | H05K 5/0017 361/748 |
| 2014/0355227 | A1* | 12/2014 | Lim | H05K 1/028 361/749 |
| 2014/0375574 | A1* | 12/2014 | Kim | G06F 3/147 345/173 |
| 2015/0003022 | A1* | 1/2015 | Chang | G02F 1/133308 361/748 |

(56) References Cited

U.S. PATENT DOCUMENTS

| | | | |
|---|---|---|---|
| 2015/0005043 A1* | 1/2015 | Shiraishi | H04M 1/0249 455/572 |
| 2015/0015512 A1* | 1/2015 | Kwak | G06F 3/0412 345/173 |
| 2015/0029113 A1* | 1/2015 | Lee | G06F 3/0412 345/173 |
| 2015/0043139 A1* | 2/2015 | Myers | G06F 1/1626 361/679.3 |
| 2015/0043142 A1* | 2/2015 | Jang | G06F 1/1652 361/679.26 |
| 2015/0043180 A1* | 2/2015 | Lee | H04M 1/0266 361/752 |
| 2015/0062840 A1* | 3/2015 | Kim | G06F 1/1652 361/749 |
| 2015/0077657 A1* | 3/2015 | Ma | H03K 17/96 349/12 |
| 2015/0109170 A1* | 4/2015 | Kang | G06F 1/182 343/702 |
| 2015/0256658 A1* | 9/2015 | Shin | G06F 1/1637 455/566 |
| 2015/0270734 A1* | 9/2015 | Davison | H02J 7/0054 320/103 |
| 2015/0382484 A1* | 12/2015 | Jung | G09G 3/3225 361/752 |
| 2016/0054613 A1* | 2/2016 | Lee | G02F 1/133308 362/97.2 |
| 2016/0219723 A1* | 7/2016 | Jung | H01L 51/0097 |
| 2016/0234362 A1* | 8/2016 | Moon | H04M 1/0202 |
| 2017/0062756 A1* | 3/2017 | Ahn | B29C 45/0053 |
| 2017/0118849 A1* | 4/2017 | Kim | H05K 5/0008 |
| 2017/0324058 A1* | 11/2017 | Min | H01L 51/524 |
| 2018/0081481 A1* | 3/2018 | Fournier | G06F 3/0414 |

FOREIGN PATENT DOCUMENTS

| | | |
|---|---|---|
| KR | 10-2014-0142418 A | 12/2014 |
| KR | 10-1474839 B1 | 12/2014 |

* cited by examiner

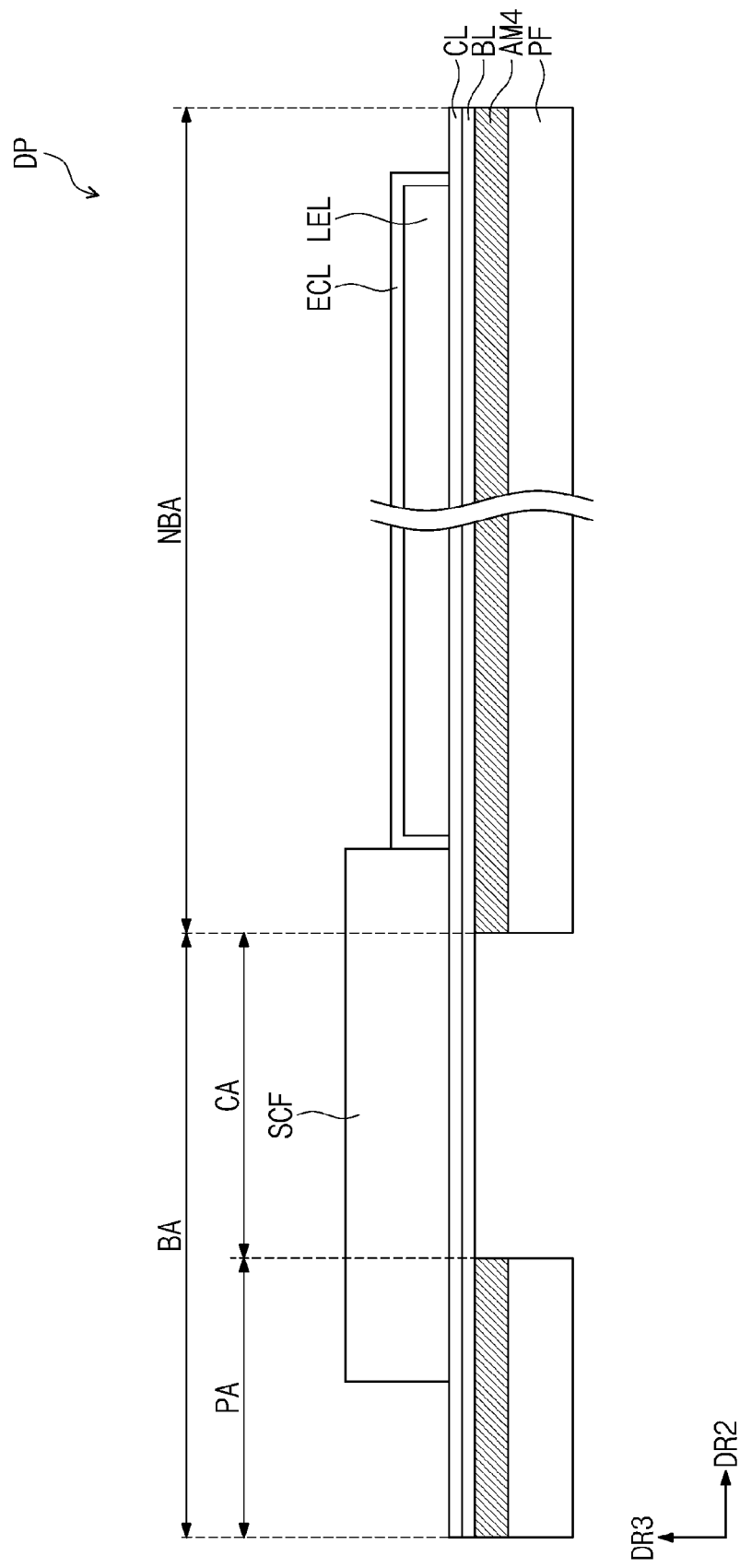

DISPLAY DEVICE AND METHOD OF MANUFACTURING ELECTRONIC DEVICE USING THE SAME

CROSS-REFERENCE TO RELATED APPLICATION

This application claims priority to and the benefit of Korean Patent Application Nos. 10-2016-0116558, filed on Sep. 9, 2016, and 10-2017-0067066, filed on May 30, 2017, the entire contents of which are hereby incorporated by reference.

BACKGROUND

1. Field

One or more aspects of example embodiments of the present disclosure relate to a display device and a method of manufacturing an electronic device using the same. More particularly, one or more aspects of example embodiments of the present disclosure relate to a display device with reduced defects and a method of manufacturing an electronic device using the display device.

2. Description of the Related Art

Various electronic devices have been developed, such as smartphones, tablet computers, notebook computers, smart television sets, etc. The electronic devices include a display device to provide information and various electronic modules.

The electronic device is manufactured by assembling the display device and the electronic modules. In some cases, the electronic modules are organically arranged using an external case and a bracket of the electronic device.

SUMMARY

Aspects of embodiments of the present disclosure are directed toward a display device capable of protecting a bending area of a display module when being transferred.

Aspects of embodiments of the present disclosure are directed toward a method of manufacturing an electronic device using the display device.

Some embodiments of the present disclosure provide a display device including a window member, a display module, a protective cover, and a coupling structure. The display module may include a non-bending area overlapped with a display area of the window member and a bending area bent from the non-bending area. The protective cover may be on a rear surface of the display module to cover the bending area of the display module. The coupling structure may couple the display module to the protective cover.

The coupling structure may include a first adhesive member. The first adhesive member may include a first part overlapped with the protective cover and a second part extending from the first part and protruding outward from the window member when viewed in a plan view.

The first part of the first adhesive member may include a base layer and first and second adhesive layers respectively on both surfaces of the base layer (e.g., front and rear surfaces of the base layer), and the second part of the first adhesive member may include a base layer integrally formed with the base layer of the first part.

Each of the first and second parts of the first adhesive member may include a base layer and first and second adhesive layers respectively on both surfaces of the base layer, and the second part may further include cover layers respectively on the first adhesive layer and the second adhesive layer.

In some embodiments, the window member may include a base member and a bezel layer on a rear surface of the base member, the bezel layer including at least one hole defined therethrough, and the first adhesive member covering the at least one hole.

The protective cover may include a roof part spaced apart from the rear surface of the display module to face the rear surface of the display module, wall parts bent from the roof part, and combine parts bent from at least a portion of the wall parts to face the rear surface of the display module. The first adhesive member may attach a corresponding combine part to the rear surface of the display module.

The protective cover may further include a holding part connected to at least one of the roof part and the wall parts, and the holding part may protrude outward from the window member when viewed in a plan view.

The first adhesive member may include a first adhesive surface attached to the display module and a second adhesive surface attached to the protective cover.

The first adhesive surface may have an adhesive force greater than an adhesive force of the second adhesive surface.

The first adhesive member may include a plurality of layers, including a first adhesive layer having the first adhesive surface and a second adhesive layer attached to the first adhesive layer and including the second adhesive surface. In some embodiments, an adhesive force of the first and second adhesive surfaces may be greater than an adhesive force of an inner adhesive surface of the first adhesive layer and an adhesive force of an inner adhesive surface of the second adhesive layer, which is attached to the inner adhesive surface of the first adhesive layer.

The display device may further include a driving control module on the rear surface of the display module and connected to the bending area of the display module, and the protective cover may further cover the driving control module.

The driving control module may include a main circuit board, a flexible circuit board connecting the main circuit board to the display module, and a protective can coupled to the main circuit board to cover electronic parts mounted on the main circuit board. The coupling structure may further include a second adhesive member that attaches the protective can to the protective cover.

The coupling structure may include an adhesive sheet including a first adhesive part attached to the protective cover, a second adhesive part attached to the display module, and a cutting line defining a boundary between the first adhesive part and the second adhesive part.

The protective cover may include a hook part coupled to an edge of the window member, the hook part may include a groove defined therein, and the edge of the window member may be inserted into the groove.

The display module may include a display panel on the rear surface of the window member to correspond to (e.g., include) the non-bending area and the bending area, a touch sensing unit located between the window member and the display panel, and a support panel on a rear surface of the display panel.

The display module may further include an adhesive member to couple the rear surface of the display panel and the support panel, the support panel including at least one opening formed therethrough to expose a portion of the adhesive member, where the portion of the exposed adhesive member is defined as the coupling structure, and a portion of the protective cover is located in the at least one opening and attached to the coupling structure.

The display panel may include a base layer located in the non-bending area and the bending area, a circuit layer positioned on a front surface of the base layer and located in the non-bending area and the bending area, an element layer on a front surface of the circuit layer to overlap with the non-bending area, an encapsulation layer on the element layer, and a protective film on a rear surface of the base layer.

The bending area may include a curvature area connected to the non-bending area and a pad area connected to the curvature area, facing and spaced apart from the non-bending area. The protective film may be located in the non-bending area and the pad area and may be omitted from the curvature area.

The display device may further include a stress control film on a front surface of the display panel to correspond to the curvature area and not overlapped with the display area of the window member.

The coupling structure may include a protrusion structure and an insertion structure defining a coupling recess or a coupling hole into which the protrusion structure is inserted. One of the protrusion structure and the insertion structure may be connected to the protective cover, and the other of the protrusion structure and the insertion structure may be connected to the display module.

Some embodiments of the present disclosure provide a method of manufacturing an electronic device, including providing a display device including a window member, a display module, a protective cover covering a bending area of the display module, and a coupling structure coupling the display module and the protective cover, removing or detaching the protective cover from the display module, and coupling the display module to a component of the electronic device.

The display device may further include a driving control module connected to the display module.

The component of the electronic device may include a mother board electrically connected to the driving control module through a connector.

The coupling structure may include an adhesive member to attach the display module to the protective cover. When the protective cover is removed or detached from the display module (e.g., to assemble the electronic device), the adhesive member may be removed or detached from the display module with the protective cover and remain attached to the protective cover.

The component of the electronic device may include a bracket or an external case physically coupled to the display module.

The coupling structure may include an adhesive member to attach the display module to the protective cover, and the adhesive member may include a plurality of adhesive layers.

When the protective cover is removed or detached from the display module, some adhesive layers may also be removed and remain attached to the protective cover.

When the protective cover is removed or detached from the display module, other adhesive layers that are not removed or detached with the protective cover may couple the display module to a bracket or an external case when the display module and the component of the electronic device are being coupled.

According to the above, in some embodiments, the protective cover covers the bending area of the display module, and defects occurring when the display device is transferred (e.g., during assembly) may be reduced. This is because the protective cover blocks external impacts and foreign substances.

The display module may be coupled to the components of the electronic device after the protective cover is removed or detached. Since the defect rate of the display module is low, a manufacturing efficiency of the electronic device may be improved.

After the protective cover is removed or detached, the display module may be coupled to the components of the electronic device using the coupling structure used to couple the protective cover to the display module. Thus, manufacturing costs may be reduced.

BRIEF DESCRIPTION OF THE DRAWINGS

The above and other advantages of the present disclosure will become readily apparent by reference to the following detailed description when considered in conjunction with the accompanying drawings wherein:

FIG. 3C is a cross-sectional view showing a display panel according to some embodiments of the present disclosure;

DETAILED DESCRIPTION

Figure 1A:
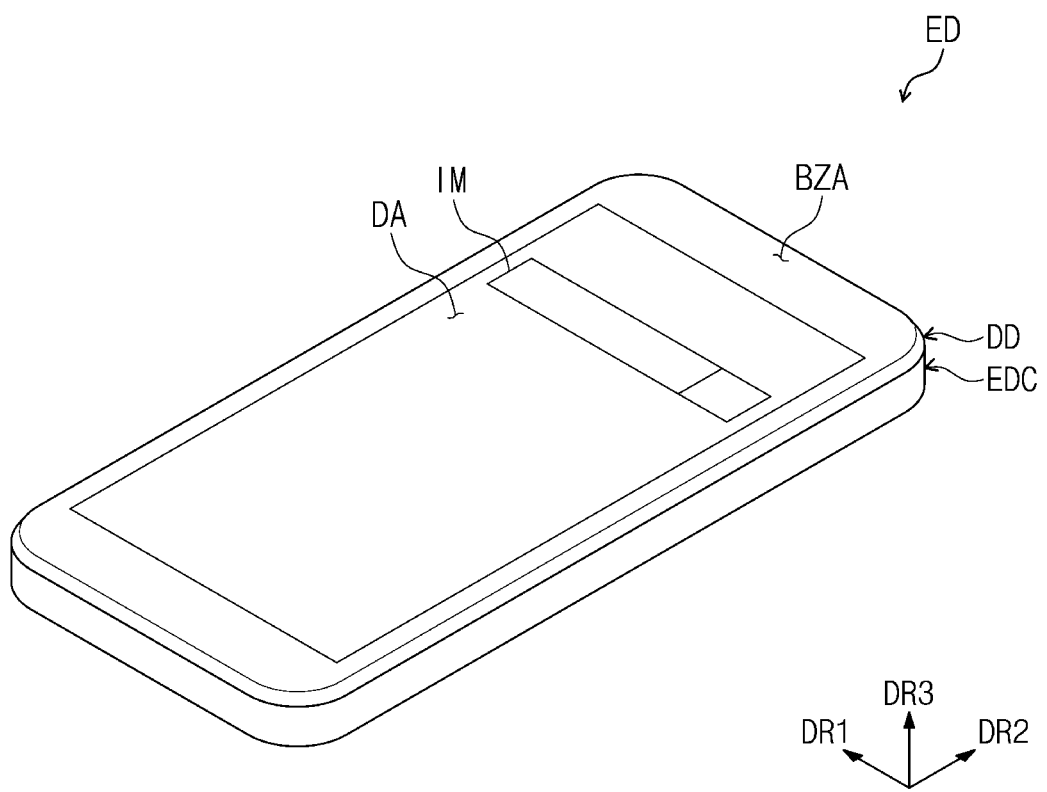
FIG. 1A is a perspective view showing an electronic device according to some embodiments of the present disclosure.

Hereinafter, example embodiments will be described in more detail with reference to the accompanying drawings, in which like reference numbers refer to like elements throughout. The present invention, however, may be embodied in various different forms, and should not be construed as being limited to only the illustrated embodiments herein. Rather, these embodiments are provided as examples so that this disclosure will be thorough and complete, and will fully convey the aspects and features of the present invention to those skilled in the art. Accordingly, processes, elements, and techniques that are not necessary to those having ordinary skill in the art for a complete understanding of the aspects and features of the present invention may not be described. Unless otherwise noted, like reference numerals denote like elements throughout the attached drawings and the written description, and thus, descriptions thereof will not be repeated. In the drawings, the relative sizes of elements, layers, and regions may be exaggerated for clarity.

In the following description, for the purposes of explanation, numerous specific details are set forth to provide a thorough understanding of various embodiments. It is apparent, however, that various embodiments may be practiced without these specific details or with one or more equivalent arrangements. In other instances, well-known structures and devices are shown in block diagram form in order to avoid unnecessarily obscuring various embodiments.

It will be understood that when an element or layer is referred to as being "on", "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. In addition, it will also be understood that when an element or layer is referred to as being "between" two elements or layers, it can be the only element or layer between the two elements or layers, or one or more intervening elements or layers may also be present.

In the drawings, the thickness, ratio, and size of each element are exaggerated for clarity. As used herein, the term "and/or" includes any and all combinations of one or more of the associated listed items.

In the following examples, the x-axis, the y-axis and the z-axis are not limited to three axes of a rectangular coordinate system, and may be interpreted in a broader sense. For example, the x-axis, the y-axis, and the z-axis may be perpendicular to one another, or may represent different directions that are not perpendicular to one another.

It will be understood that, although the terms "first," "second," "third," etc., may be used herein to describe various elements, components, regions, layers and/or sections, these elements, components, regions, layers and/or sections should not be limited by these terms. The use of the terms first, second, etc. do not denote any order or importance, but rather the terms first, second, etc. are used to distinguish one element from another. Thus, a first element, component, region, layer or section discussed below could be termed a second element, component, region, layer or section without departing from the teachings of the present invention. It is to be understood that the singular forms "a," "an," and "the" include plural referents unless the context clearly dictates otherwise.

Expressions such as "at least one of," when preceding a list of elements, modify the entire list of elements and do not only modify the individual elements of the list. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. Like numbers refer to like elements throughout. As used herein, the term "and/or" includes any and all combinations of one or more of the associated listed items.

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly.

It will be further understood that the terms "comprises," "comprising," "includes" and/or "including", when used in this specification, specify the presence of stated features, integers, steps, operations, elements, and/or components, but do not preclude the presence or addition of one or more other features, integers, steps, operations, elements, components, and/or groups thereof.

As used herein, the term "substantially," "about," and similar terms are used as terms of approximation and not as terms of degree, and are intended to account for the inherent deviations in measured or calculated values that would be recognized by those of ordinary skill in the art. Further, the use of "may" when describing embodiments of the present invention refers to "one or more embodiments of the present invention." As used herein, the terms "use," "using," and "used" may be considered synonymous with the terms "utilize," "utilizing," and "utilized," respectively. Also, the term "exemplary" is intended to refer to an example or illustration.

When a certain embodiment may be implemented differently, a specific process order may be performed differently from the described order. For example, two consecutively described processes may be performed substantially at the same time or performed in an order opposite to the described order.

Various embodiments are described herein with reference to sectional illustrations that are schematic illustrations of embodiments and/or intermediate structures. As such, variations from the shapes of the illustrations as a result, for example, of manufacturing techniques and/or tolerances, are to be expected. Thus, embodiments disclosed herein should not be construed as limited to the particular illustrated shapes of regions, but are to include deviations in shapes that result from, for instance, manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the drawings are schematic in nature and their shapes are not intended to illustrate the actual shape of a region of a device and are not intended to be limiting.

Unless otherwise defined, all terms (including technical and scientific terms) used herein have the same meaning as commonly understood by one of ordinary skill in the art to which the present invention belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

Figure 1B:
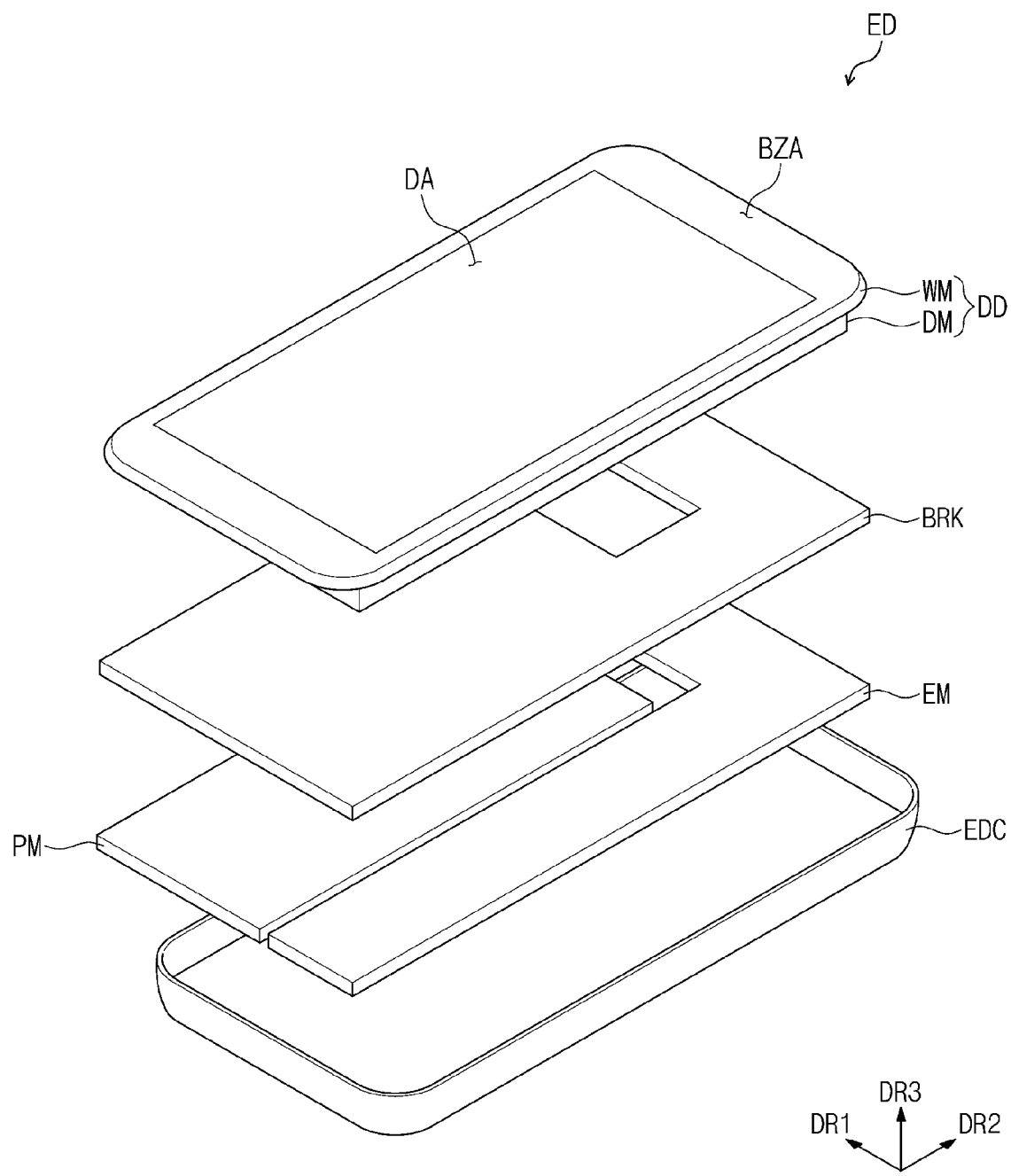
FIG. 1B is an exploded perspective view showing an electronic device according to some embodiments of the present disclosure.
Figure 2:
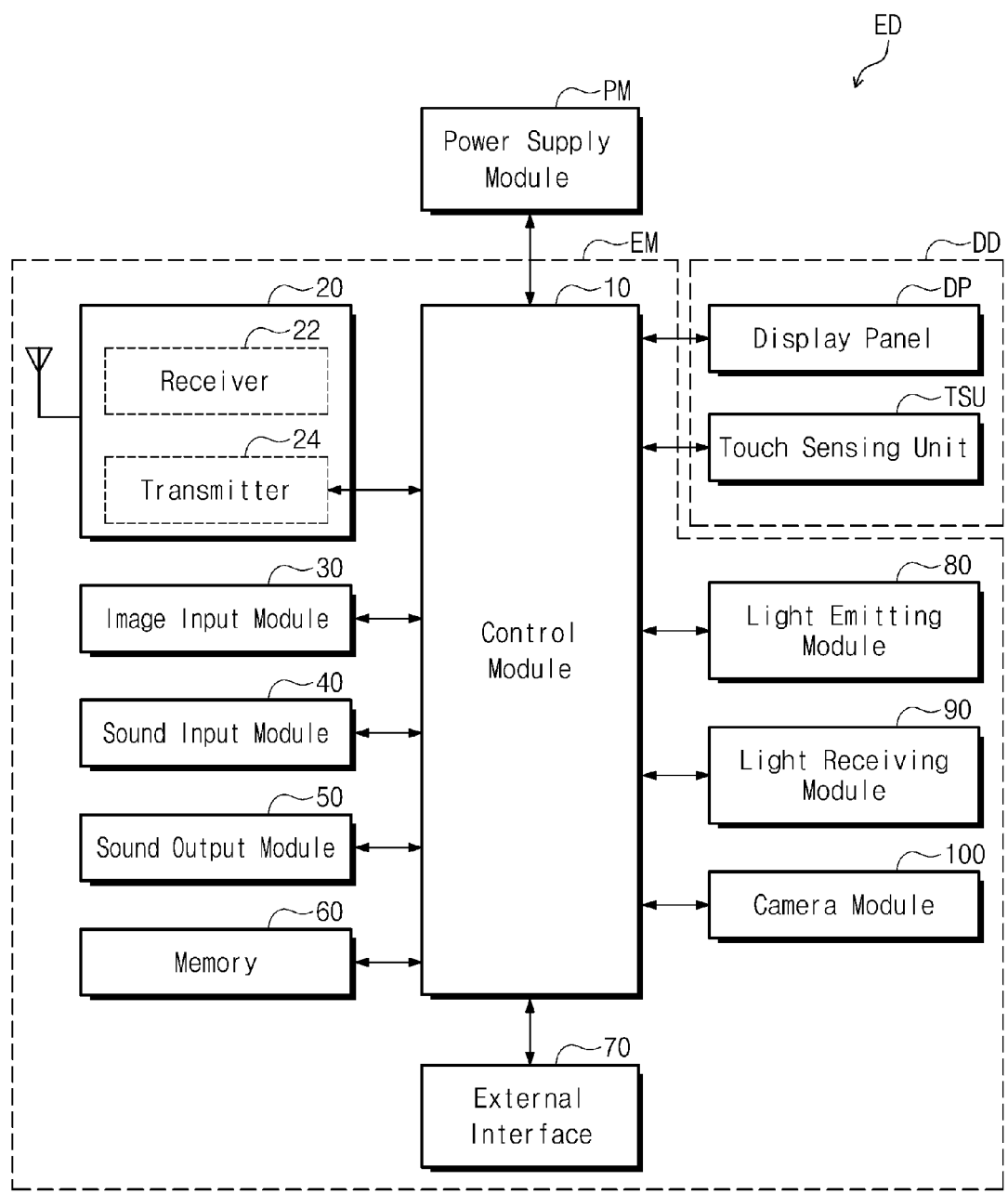
FIG. 2 is a block diagram showing an electronic device according to some embodiments of the present disclosure.

FIG. 1A is a perspective view showing an electronic device ED according to some embodiments of the present disclosure. FIG. 1B is an exploded perspective view showing an electronic device ED according to some embodiments of the present disclosure. FIG. 2 is a block diagram showing an electronic device ED according to some embodiments of the present disclosure.

In some embodiments described below, a smartphone will be described as a representative example of the electronic device ED, but it should be understood that the electronic device ED is not limited to a smartphone. That is, the electronic device ED of some embodiments may be implemented as a tablet, a notebook computer, or a smart television set, or other suitable electronic devices.

Referring to FIG. 1A, a display surface in which an image IM is displayed may be substantially parallel to a surface defined by a first directional axis DR1 and a second directional axis DR2. The display surface may include a display area DA and a bezel area BZA located adjacent to the display area DA. In some embodiments, for example, the image IM may include a web search box. In some embodiments, the display area DA may have a quadrangular shape (e.g., a square or rectangular shape). The bezel area BZA may surround the display area DA. In other words, the bezel area BZA may correspond to (e.g., include) an edge of the display surface. In some embodiments of the present disclosure, the bezel area BZA may be located at two areas facing each other in the first directional axis DR1 and/or two areas facing each other in the second directional axis DR2 (e.g., the two areas facing each other in the first and/or second directional axes DR1, DR2 may be spaced apart). Further, front and rear surfaces of the components of the electronic device ED may be indicated with respect to the direction in which the image IM is displayed.

A normal line direction of the display surface, i.e., a thickness direction of the electronic device ED, is indicated by a third directional axis DR3. However, the directional axes indicated by the first, second, and third directional axes DR1, DR2, and DR3 are relative to each other, and may be changed to other directional axes in some embodiments. Hereinafter, first to third directions will be understood to correspond to the directions respectively indicated by the first to third directional axes DR1 to DR3, and thus the first to third directions are assigned with the same reference numerals as the first to third directional axes DR1 to DR3.

Referring to FIGS. 1A and 1B, the electronic device ED may include a display device DD, an electronic module EM, a power supply module PM, a bracket BRK, and an external case EDC. While FIGS. 1A and 1B depict the above-mentioned elements according to some embodiments, it should be appreciated that these elements may have other shapes and configurations.

The display device DD may include a window member WM and a display module DM. The window member WM may provide a front surface of the electronic device ED. The display module DM may be on a rear surface of the window member WM (e.g., relative to the direction of the image IM) to generate an image. In addition, the display module DM may sense a user's input (e.g., a user's touch). The display module DM may be electrically connected to the electronic module EM through a flexible circuit board.

The power supply module PM may supply electrical power (e.g., voltage and/or current) required for the overall operation of the electronic device ED. The power supply module PM may include a suitable battery module.

The bracket BRK may be coupled with the display device DD and/or the external case EDC to divide an inner space of the electronic device ED. The bracket BRK may provide a space in which other components may be arranged. In addition, the bracket BRK may support the display device DD such that the display device DD is fixed relative to other components (e.g., the display device DD does not move independent of the other components when assembled). The bracket BRK may include a coupling recess defined therein corresponding to a shape of the electronic module EM to fix the electronic module EM thereto. The bracket BRK may include metal or plastic members. In FIG. 1B, one bracket BRK is shown as a representative example, but the electronic device ED may include a plurality of brackets BRK.

The external case EDC may be coupled to the bracket BRK and/or the display device DD. The external case EDC may provide an external surface of the electronic device ED. In some embodiments, the external case EDC may have a single body, but the external case EDC may include a plurality of bodies assembled with each other. The external case EDC may include a plurality of frames and/or plates formed of glass, plastic, and/or metal materials.

The electronic module EM may include a mother board and various functional modules mounted on the mother board to operate the electronic device ED. The mother board may be electrically connected to the display device DD via a connector. In some embodiments, the mother board may include a rigid printed circuit board.

Referring to FIG. 2, the electronic module EM may include a control module 10, a wireless communication module 20, an image input module 30, a sound input module 40, a sound output module 50, a memory 60, an external interface 70, a light emitting module 80, a light receiving module 90, and a camera module 100. Among the modules, some modules may be electrically connected to the mother board without being mounted on the mother board, for example, via a flexible circuit board.

The control module 10 may control an overall operation of the electronic device ED. In some embodiments, for instance, the control module 10 may activate or deactivate the display device DD. The control module 10 may control the image input module 30, the sound input module 40, and/or the sound output module 50 based on a touch signal received from the display device DD. The control module 10 may include a microprocessor, but is not limited thereto or thereby.

The wireless communication module 20 may transmit or receive a wireless signal to or from another terminal using a Bluetooth or WiFi line. The wireless communication module 20 may transmit or receive a sound signal through a common communication line. The wireless communication module 20 may include a transmitter 22 that modulates and transmits a signal, and a receiver 24 that demodulates the signal received thereto.

The image input module 30 may process an image signal to convert the image signal to image data for displaying in the display device DD. The sound input module 40 may receive an external sound signal through a microphone during a recording mode or a voice recognition mode and may convert the received external sound signal to electrical sound data. The sound output module 50 may convert sound data received from the wireless communication module 20 or sound data stored in the memory 60, and may output the converted sound data to outside the electronic device DD.

The external interface 70 may be connected to an external charger, a wired/wireless data port, or a card socket (e.g., a memory card, an SIM/UIM card, etc.) to serve as an interface.

The light emitting module 80 may generate and output light. In some embodiments, the light emitting module 80 may output an infrared ray. The light emitting module 80 may include a light emitting diode (LED) device. The light receiving module 90 may sense light, for example, infrared rays (such as infrared rays output by the light emitting module 80 and reflected by objects). The light receiving module 90 may be activated when an infrared ray having a set or predetermined level (e.g., intensity) or above is sensed. The light receiving module 90 may include a complementary metal-oxide-semiconductor (CMOS) sensor. In some embodiments, after an infrared ray is generated by and output from the light emitting module 80, the infrared ray may be reflected by an external object (e.g., a user's finger or face), and the reflected infrared ray may be incident to (e.g., received by) the light receiving module 90. The camera module 100 takes an external image.

Figure 3A:
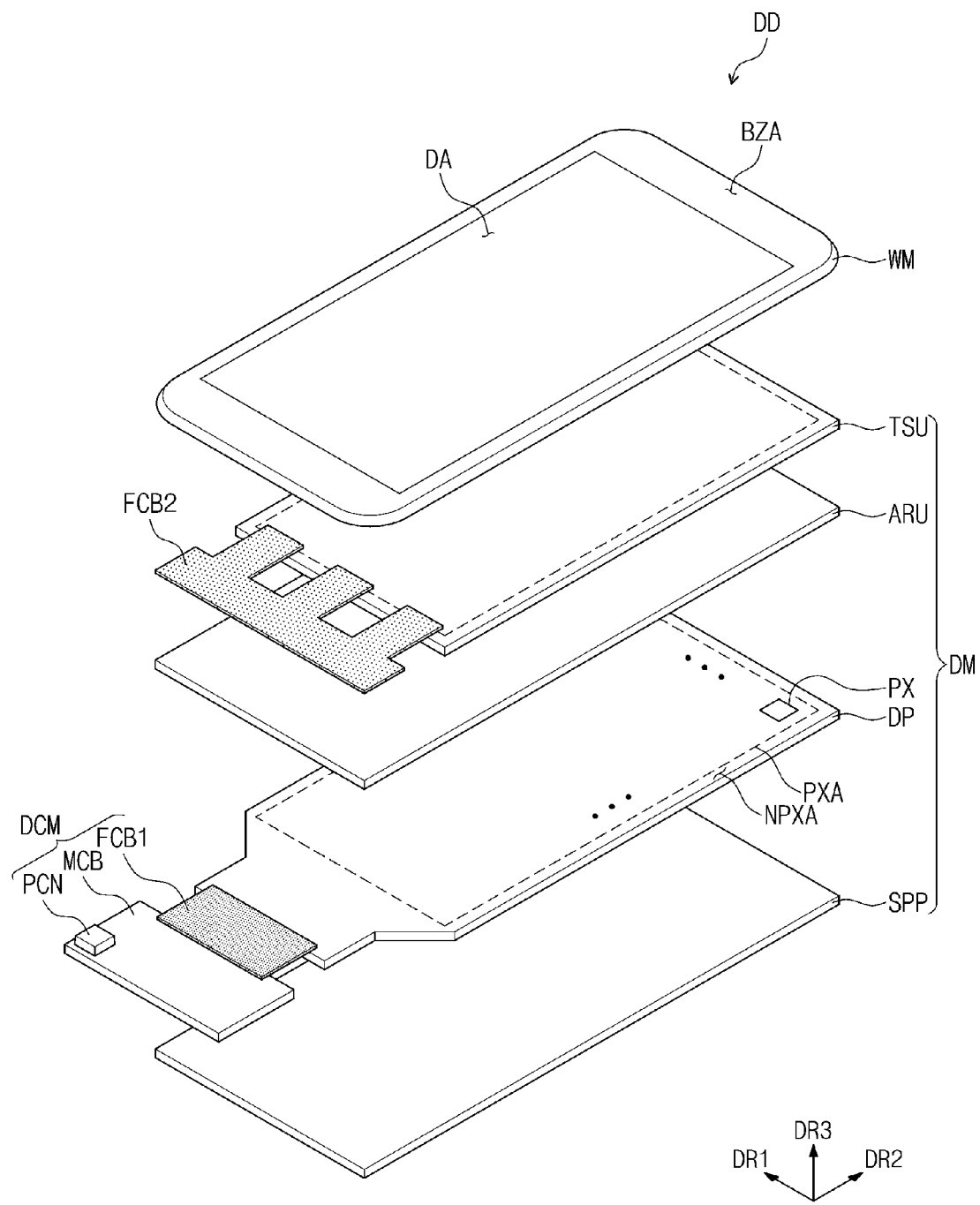
FIG. 3A is an exploded perspective view showing a display device according to some embodiments of the present disclosure.
Figure 3B:
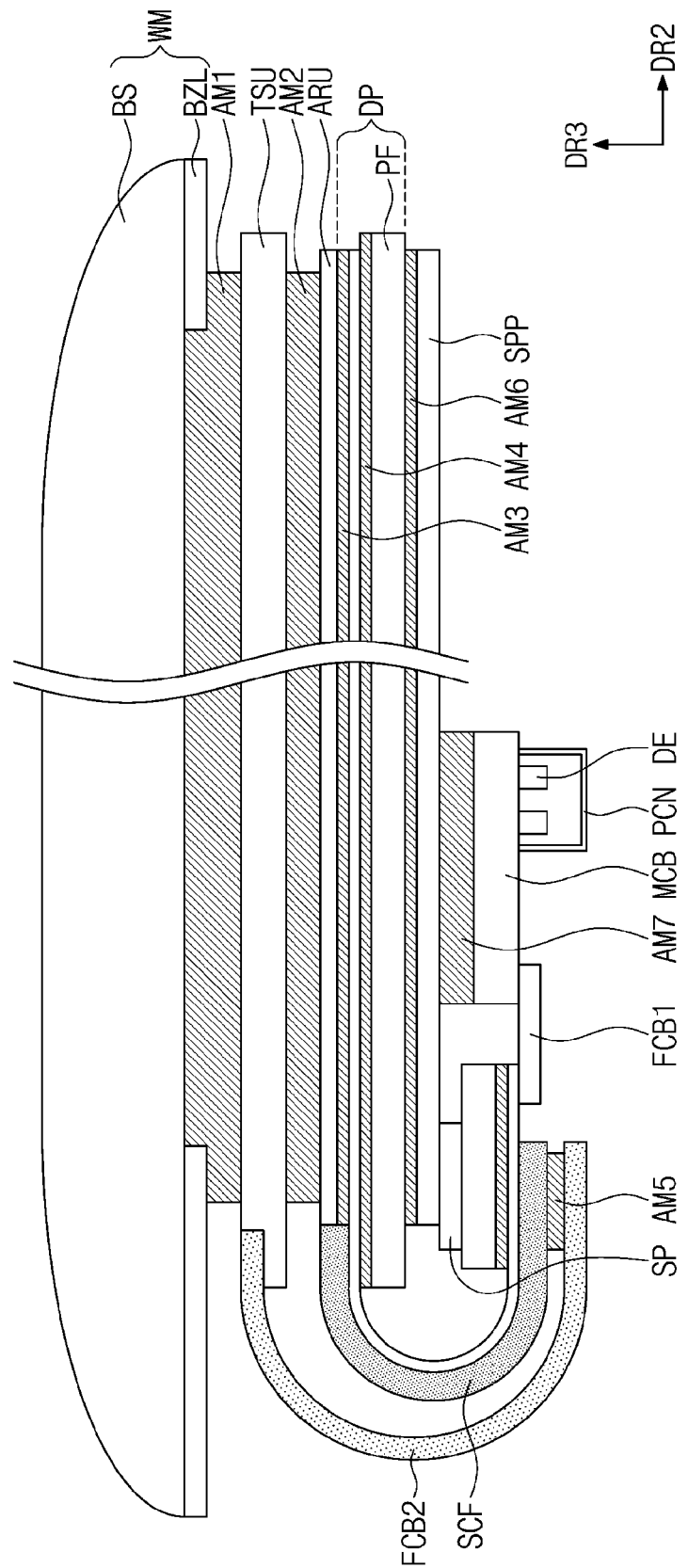
FIG. 3B is a cross-sectional view showing a display device according to some embodiments of the present disclosure.

FIG. 3A is an exploded perspective view showing a display device DD according to some embodiments of the present disclosure, omitting an adhesive member. FIG. 3B is a cross-sectional view showing a display device DD according to some embodiments of the present disclosure. FIG. 3C is a cross-sectional view showing a display panel DP according to some embodiments of the present disclosure. FIGS. 3B and 3C show cross-sectional views in the second directional axis DR2.

Referring to FIGS. 3A and 3B, the display device DD may include the window member WM and the display module DM. FIGS. 3A and 3B show the display device DD disassembled from the electronic device ED shown in FIGS. 1A and 1B. The display device DD in some embodiments may further include a protective cover PC (see FIGS. 5A and 5B) and a coupling structure that couples the protective cover PC and the display module DM, described in more detail below. In some embodiments, the display device DD may remain coupled to the bracket BRK and/or the external case EDC after the protective cover PC and the coupling structure are removed (e.g., during assembly), and accordingly, the protective cover PC and the coupling structure are not shown in FIGS. 3A and 3B.

As shown in FIGS. 3A and 3B, the window member WM may include a base member BS and a bezel layer BZL on a rear surface of the base member BS (e.g., relative to the image IM). The window member WM may provide the display surface, and therefore may include the display area DA and the bezel area BZA, described above. An area in which the bezel layer BZL is located is defined as the bezel area BZA shown in FIGS. 1A and 1B. In some embodiments, the window member WM may have a flat shape in the display area DA, but the shape of the window member WM is not limited thereto or thereby and may be varied. The window member WM may provide a curved surface extending in the second directional axis DR2 in the display area DA.

The base member BS may include a glass substrate, a sapphire substrate, and/or a plastic film. The base member BS may have a single-layer structure or a multi-layer structure. For instance, the base member BS may include a plurality of plastic films attached to each other by an adhesive. In some embodiments, for example, the base member BS may include a glass substrate and a plastic film attached to the glass substrate by the adhesive.

The bezel layer BZL may have a single-layer structure or a multi-layer structure. The bezel layer BZL having a multi-layer structure may include a buffer layer for improving an adhesive force, a pattern layer for providing a set or predetermined pattern, and an achromatic layer. The pattern layer may provide a pattern called a hair line. The achromatic layer may include an organic mixture containing a black pigment or dye. The layers of the bezel layer BZL may be formed by deposition, printing, or coating methods. In some embodiments, the window member WM may further include a functional coating layer on an entire surface of the base member BS. The functional coating layer may include an anti-fingerprint layer, an anti-reflection layer, and/or a hard coating layer.

As shown in FIGS. 3A and 3B, the display module DM may include a display panel DP, a touch sensing unit TSU, an anti-reflection unit ARU, a support panel SPP, and a driving control module DCM. The display panel DP may be a flexible display panel, e.g., an organic light emitting display panel. FIG. 3A shows the display panel DP and the touch sensing unit TSU in an unfolded state. The display panel DP may include a pixel area PXA including a pixel PX and a non-pixel area NPXA including peripheral components, such as signal lines, banks, etc. The non-pixel area may be adjacent to the pixel area PXA when viewed in a plan view. The pixel PX is not located in the non-pixel area NPXA. The pixel area PXA and the non-pixel area NPXA may respectively correspond to (e.g., have a similar shape and size to) the display area DA (see FIG. 1A) and the bezel area BZA (see FIG. 1A). However, the corresponding areas do not need to be completely identical to each other in shape and/or size, etc.

The touch sensing unit TSU may obtain coordinate information of an external input. The touch sensing unit TSU may sense inputs in a variety of forms provided from outside the electronic device ED. For instance, the touch sensing unit TSU may sense an input by a user's body and external inputs in various forms, such as light, heat, pressure, etc. In addition, the touch sensing unit TSU may sense an input that is proximate to a sensing surface (e.g., without contacting the sensing surface) as well as an input that makes contact with the sensing surface.

In some embodiments, the touch sensing unit TSU may be, for example, an electrostatic capacitive type touch panel or an electromagnetic induction type touch panel. The electrostatic capacitive type or electromagnetic induction type touch panel may include a base layer and touch sensors. The touch panel may include an area in which the touch sensors are arranged and an area in which the touch sensors are omitted when viewed in a plan view. The area in which the touch sensors are arranged may correspond to the pixel area PXA. The anti-reflection unit ARU may include a polarization film and/or a retardation film. The polarization film and the retardation film may be a suitable stretch film.

The driving control module DCM may include a main circuit board MCB, driving elements DE mounted on the main circuit board MCB, and a flexible circuit board FCB1 (hereinafter, referred to as a "first flexible circuit board") connecting the main circuit board MCB and the display panel DP. The driving control module DCM may further include a protective can PCN coupled to the main circuit board MCB to cover the driving elements DE. The protective can PCN may be a protective cover formed of a metal material and may be coupled to the main circuit board MCB by a soldering process. The main circuit board MCB may be electrically connected to the mother board of the electronic module EM (see FIG. 1B) through a connector.

The support panel SPP may be on the rear surface of the display panel DP to support the display panel DP. The support panel SPP may be a metal plate having a hardness (e.g., stiffness) equal to or greater than a reference hardness. The support panel SPP may be a stainless steel plate. The support panel SPP may have a black color to block an external light incident to the display panel DP.

In some embodiments, the touch sensing unit TSU and the anti-reflection unit ARU are coupled to each other by adhesive members, but at least one of the touch sensing unit TSU and the anti-reflection unit ARU may be omitted. At least one of the touch sensing unit TSU and the anti-reflection unit ARU may be integrally formed with the display panel DP during manufacture (e.g., through a continuous process). As shown in FIG. 3C, an encapsulation layer ECL may be provided. Touch sensors on the encapsulation layer ECL may have similar functions to the touch sensing unit TSU, and color filters on the encapsulation layer may have similar functions to the anti-reflection unit ARU.

In some embodiments, a separate driving control module DCM may be omitted. In such embodiments, driving elements DE may be mounted on the display panel DP, and thus the driving control module DCM may be integrally formed with the display panel DP. In such embodiments, however, the first flexible circuit board FCB1 may still be connected to the display panel DP (e.g., without the separate driving control module DCM).

Hereinafter, the display module DM will be described in more detail with reference to FIGS. 3B and 3C. First, second, third, fourth, fifth, sixth, and seventh adhesive members AM1, AM2, AM3, AM4, AM5, AM6, and AM7 described hereinafter may be an optically clear adhesive (OCA) film, an optically clear resin (OCR), and/or a pressure sensitive adhesive (PSA) film. The first to seventh adhesive members AM1 to AM7 may include a light-curable adhesive material and/or a heat-curable adhesive material, but they are not limited thereto or thereby. In addition, some of the first to seventh adhesive members AM1 to AM7 may be omitted.

In some embodiments, the touch sensing unit TSU may be on a rear surface of the window member WM, and may be coupled to each other by the first adhesive member AM1. The anti-reflection unit ARU may be on a rear surface of the touch sensing unit TSU, and may be coupled to each other by the second adhesive member AM2. The display panel DP may be on a rear surface of the anti-reflection unit ARU, and may be coupled to each other by the third adhesive member AM3.

The display module DM may include a non-bending area NBA and a bending area BA bent from the non-bending area NBA (see FIG. 3C). The non-bending area NBA and the bending area BA may be defined with respect to the display panel DP. The non-bending area NBA may be defined as an area facing the window member WM. In addition, the non-bending area NBA may be defined as an area overlapped with the third adhesive member AM3.

As shown in FIG. 3A, the display panel DP may include varied widths in the first direction DR1. Referring to FIGS. 3A and 3C again, the bending area BA may have a width smaller than that of the non-bending area NBA in the first direction DR1. When the bending area BA has a relatively small width (e.g., in the first direction DR1), the display panel DP may be easily bent. In addition, a protective cover PC (see FIGS. 4A and 4B), described below, may have a size such that the protective cover PC does not protrude outward from the display module DM in the first direction DR1. Meanwhile, in some embodiments, the display panel DP may include a boundary area having a gradually decreasing width (see FIG. 3A), and may include the bending area BA and/or the non-bending area NBA. In some embodiments, a gradually decreasing width boundary area may be omitted.

As shown in FIGS. 3B and 3C, the display panel DP may include a base layer BL, a circuit layer CL, an element layer LEL, the encapsulation layer ECL, and a protective film PF. The base layer BL is located in the non-bending area NBA and the bending area BA. The base layer BL may be a resin layer including polyimide (PI), but is not limited thereto or thereby.

The circuit layer CL may be located over the base layer BL. The circuit layer CL may be located in the non-bending area NBA and the bending area BA. The circuit layer CL may have a multi-layer structure including an insulating layer and a conductive layer. The circuit layer CL may include a pixel circuit including a thin film transistor and signal lines connected to the pixel circuit.

The element layer LEL may be on a front surface of the circuit layer CL. The element layer LEL may include a light emitting device, e.g., an organic light emitting device. The encapsulation layer ECL may be on the element layer LEL to encapsulate the element layer LEL. The encapsulation layer ECL may have a multi-layer structure of an organic layer/an inorganic layer, which is called a thin film encapsulation (TFE), or may include an encapsulation substrate and a sealant.

The protective film PF may be on a rear surface of the base layer BL. The window member WM and the protective film PF may be coupled to each other by the fourth adhesive member AM4. The protective film PF may include a plastic film manufactured by a separate molding process as its base layer. The protective film PF may include a plastic film containing one selected from the groups consisting of polyethersulphone (PES), polyacrylate (PAR), polyetherimide (PEI), polyethylene napthalate (PEN), polyethylene terepthalate (PET), polyphenylene sulfide (PPS), polyallylate, polyimide (P1), polycarbonate (PC), and poly(aryleneether sulfone), and combinations thereof.

The material for the protective film PF is not limited to plastic resins and may include an organic/inorganic composite material. The protective film PF may include a porous organic layer and an inorganic material filled in pores of the organic layer.

The bending area BA of the display module DM may include a curvature area CA and a pad area PA. The curvature area CA may be an area connected to the non-bending area NBA and is substantially curved. The pad area PA may be an area connected to the curvature area CA and is not curved. The pad area PA may face and be spaced apart from the non-bending area NBA. Pads of the circuit layer CL may be aligned in the pad area PA. The pad area PA may be connected to the first flexible circuit board FCB1.

The protective film PF may be located in the non-bending area NBA and the pad area PA of the bending area BA, and the protective film PF may be omitted from the curvature area CA of the bending area BA. The protective film PF may include a slit defined therein to correspond to the curvature area CA. Since the protective film PF is not located in the curvature area CA, stresses occurring in the circuit layer CL when the circuit layer CL is bent may be reduced. A portion of the fourth adhesive member AM4 corresponding to the curvature area CA may be omitted or removed, but is not limited thereto or thereby. In some embodiments of the present disclosure, the protective film PF may include a groove defined therein to correspond to the curvature area CA. That is, the protective film PF may have a relatively smaller or thinner thickness in the curvature area CA than that in other areas or patterns, which may be obtained by partially removing the protective film PF area defined in the curvature area CA.

The display panel DP may further include a stress control film SCF on a front surface of at least the curvature area CA. The stress control film SCF may be on the circuit layer CL. The stress control film SCF may provide a neutral surface of the curvature area CA, which is defined when the display panel DP is bent, closer to the circuit layer CL. The stress control film SCF may partially overlap with the non-bending area NBA and the pad area PA. The stress control film SCF may include a plastic film, such as described above for the protective film PF.

A flexible circuit board FCB2 (hereinafter, referred to as a "second flexible circuit board") may be connected to the touch sensing unit TSU and may be at least partially bent. The second flexible circuit board FCB2 may be bent to surround the stress control film SCF along an outside (e.g., front surface) of the curvature area CA (see FIG. 4C). The second flexible circuit board FCB2 may be coupled to a portion of the stress control film SCF on the pad area PA by the fifth adhesive member AM5.

The support panel SPP may be on a rear surface of the protective film PF. The support panel SPP and the protective film PF may be coupled to each other by the sixth adhesive member AM6. A spacer SP may be located between a portion of the protective film PF overlapped with the pad area PA and the support panel SPP to maintain the curvature of the curvature area CA.

The main circuit board MCB may be on a rear surface of the support panel SPP. The support panel SPP and the main circuit board MCB may be coupled to each other by the seventh adhesive member AM7.

Figure 4A:
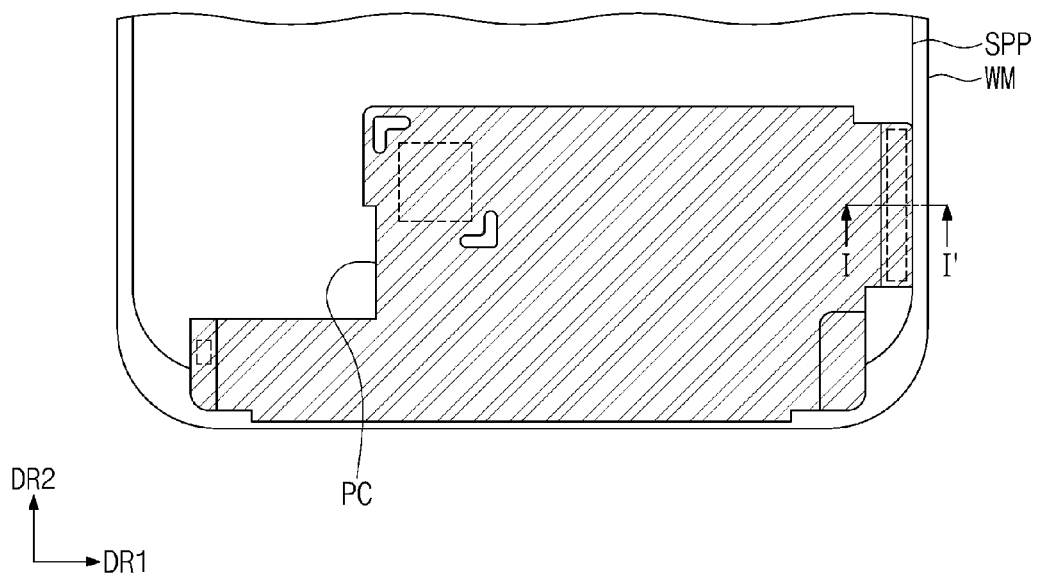
FIGS. 4A and 4B are cross-sectional views showing portions of a display device according to some embodiments of the present disclosure.
Figure 4B:
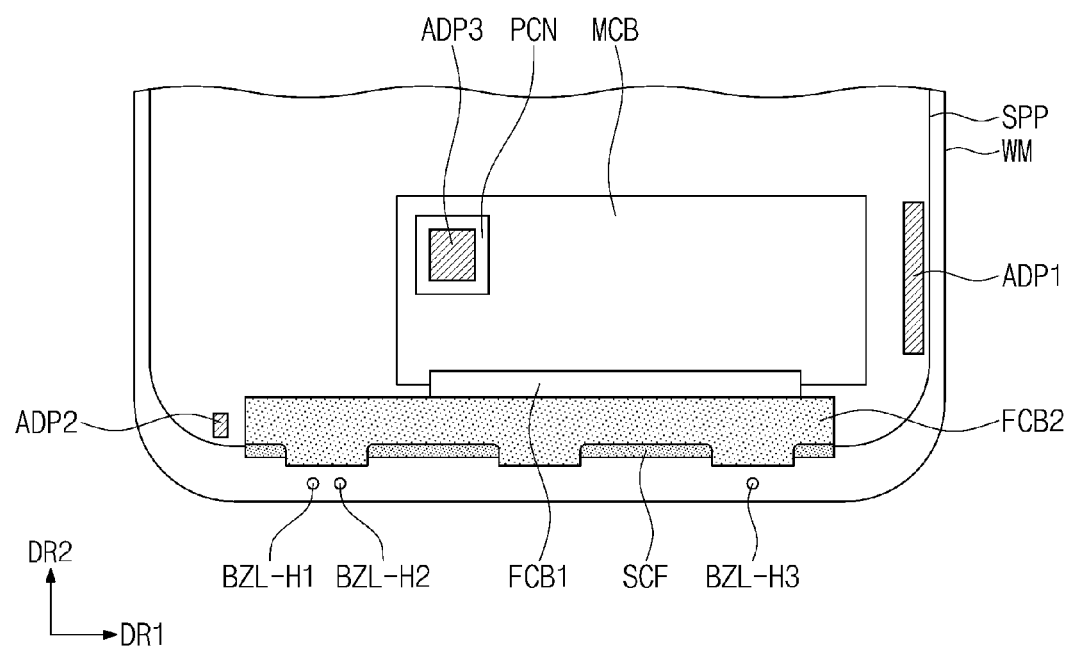
Figure 4C:
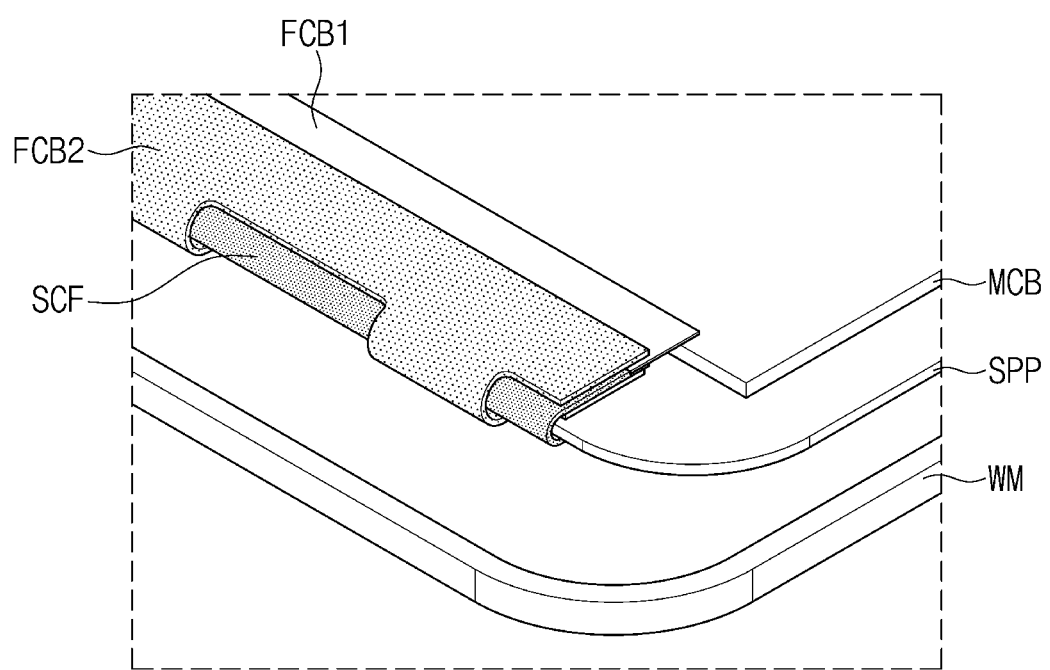
FIG. 4C is a perspective view showing a portion of a display device according to some embodiments of the present disclosure.
Figure 5A:
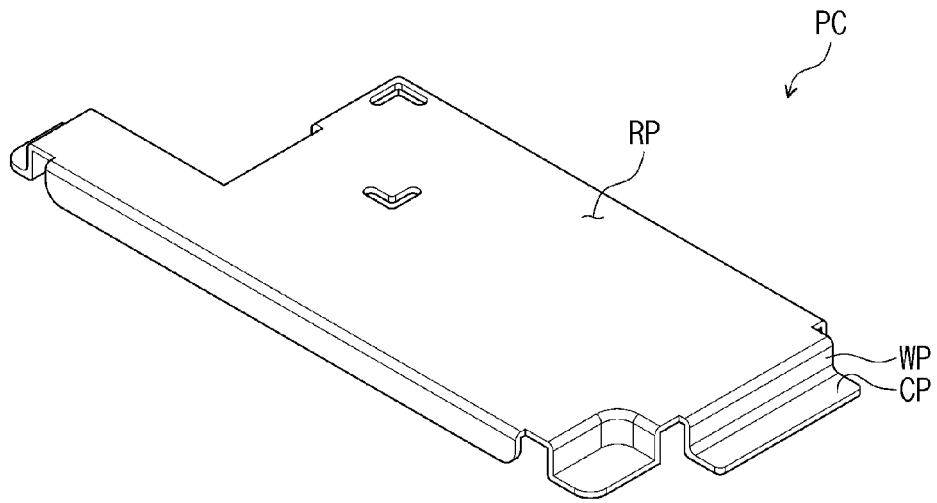
FIGS. 5A and 5B are perspective views showing a protective cover according to some embodiments of the present disclosure.
Figure 5B:
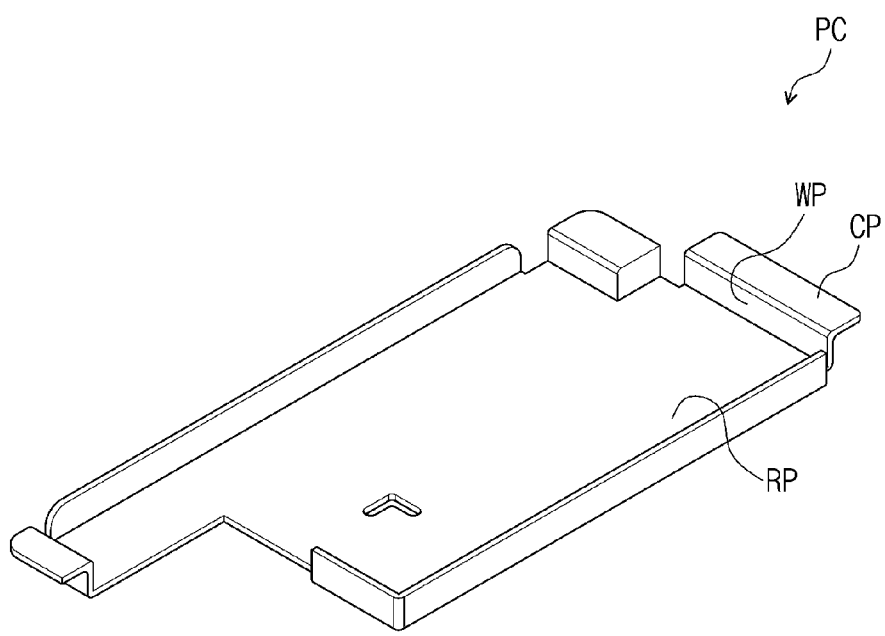

FIGS. 4A and 4B are cross-sectional views showing portions of a display device DD according to some embodiments of the present disclosure. FIG. 4C is a perspective view showing a portion of a display device DD according to some embodiments of the present disclosure. FIGS. 5A and 5B are perspective views showing a protective cover PC according to some embodiments of the present disclosure. FIG. 5B shows an inverted shape of the protective cover PC of FIG. 5A. In FIGS. 4A to 4C and 5A and 5B, detailed descriptions of the same elements as those of FIGS. 1 to 3C will be omitted.

The display device DD according to some embodiments further includes a protective cover PC on a rear surface of the display module DM to cover the bending area BA and a coupling structure that couples the protective cover PC and the display module DM. Since the protective cover PC covers the bending area BA, defects occurring when the display device DD is transferred (e.g., during assembly) are reduced. This is because the protective cover PC blocks external impacts and foreign substances.

The protective cover PC may be, but is not limited to, a plastic member such as polycarbonate. The protective cover PC may be manufactured by a plastic molding method, such as an extrusion molding method, an injection molding method, etc. However, the material of the protective cover PC is not limited thereto or thereby, and the protective cover PC may be an organic/inorganic composite member.

The protective cover PC may further cover the driving control module DCM on the rear surface of the display module DM. The driving control module DCM is protected by the protective cover PC from the external impacts and foreign substances.

In some embodiments, the coupling structure may include adhesive members ADP1, ADP2, and ADP3. Hereinafter, the adhesive members serving as the coupling structure may include a base layer and adhesive layers respectively on both surfaces of the base layer (e.g., front and rear surfaces of the base layer). The adhesive members ADP1, ADP2, and ADP3 may be the same as adhesive members located inside the display module DM (e.g., the same types of adhesive members). However, the types of the adhesive members ADP1, ADP2, and ADP3 is not limited thereto or thereby. The adhesive members ADP1, ADP2, and ADP3 may be opaque. FIGS. 4A to 4C show three adhesive members ADP1, ADP2, and ADP3 according to some embodiments. Some of the adhesive members ADP1, ADP2, and ADP3 may be attached to the support panel SPP, and the others of the adhesive members ADP1, ADP2, and ADP3 may be attached to the protective can PCN.

As shown in FIGS. 4A and 4B, the protective cover PC may cover a plurality of holes BZL-H1 to BZL-H3 formed through the bezel layer BZL. Three holes BZL_H1, BZL-H2, and BZL-H3 are shown in FIG. 4B as a representative example. As shown in FIG. 4B, the holes BZL_H1, BZL-H2, and BZL-H3 may be exposed to the outside by removing or detaching the protective cover PC.

The holes BZL_H1, BZL-H2, and BZL-H3 may be formed by partially removing the bezel layer BZL such that the base member BS is exposed. Light may be transmitted through the holes BZL_H1, BZL-H2, and BZL-H3. A first hole BZL-H1 corresponds to the light emitting module 80, a second hole BZL-H2 corresponds to the light receiving module 90, and a third hole BZL-H3 corresponds to the camera module 100.

Hereinafter, the protective cover PC will be described in more detail with reference to FIGS. 5A and 5B. In some embodiments, the protective cover PC may include a roof part RP, wall parts WP, and combine parts CP. The roof part RP may be spaced apart from the support panel SPP (see FIGS. 4A and 4B) to face the support panel SPP. The roof part RP may cover the bending area BA and the driving control module DCM on the rear surface of the display module DM. The wall parts WP may be bent from the roof part RP. The wall parts WP may be bent from different edges of the roof part RP relative to each other. The wall parts WP may be connected to each other or spaced apart from each other. One or more of the wall parts WP may face the curvature area CA (see FIGS. 3B and 3C). The shape of the protective cover PC is not limited to a specific shape as long as the protective cover PC provides a set or predetermined space in which a portion of the display module DM may be located. In some embodiments of the present disclosure, the roof part RP and the wall parts WP may form a dome shape.

The combine parts CP may be bent from at least a portion of the wall parts WP to face the rear surface of the display module DM. Some adhesive members ADP1 and ADP2 may be on some of the combine parts CP.

Figure 6A:
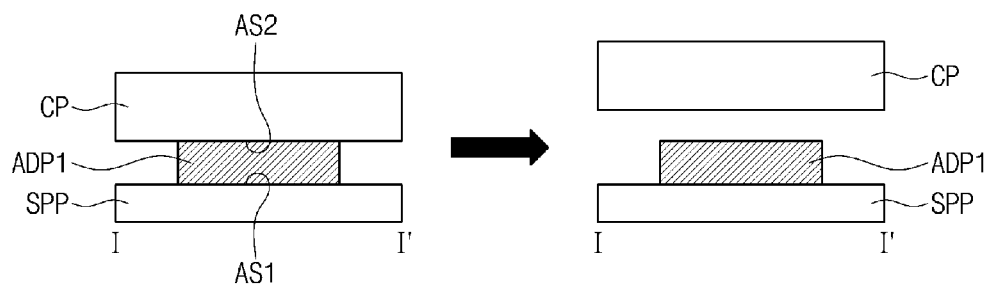
FIG. 6A is a cross-sectional view showing a portion of a display device according to some embodiments of the present disclosure.
Figure 6B:
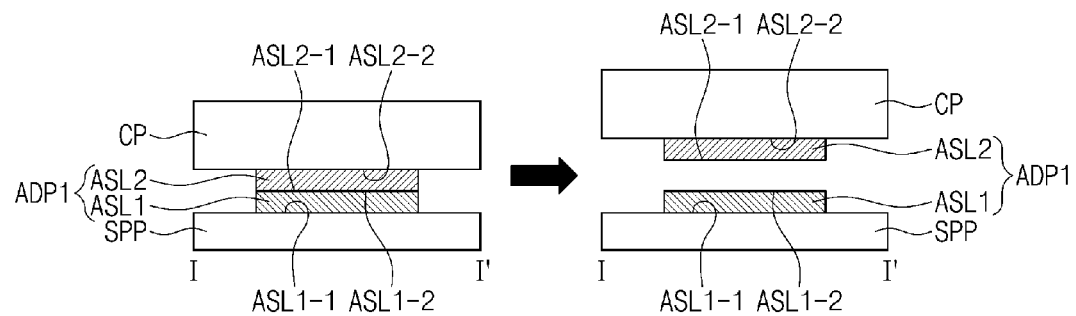
FIG. 6B is a cross-sectional view showing a portion of a display device according to some embodiments of the present disclosure.

FIG. 6A is a cross-sectional view showing a portion of a display device according to some embodiments of the present disclosure. FIG. 6B is a cross-sectional view showing a portion of a display device according to some embodiments of the present disclosure. FIGS. 6A and 6B show cross-sections taken along a line I-I' of FIG. 4A. FIGS. 6A and 6B each show a state in which the protective cover PC is coupled to the support panel SPP and a state in which the protective cover PC is separated from the support panel SPP.

The adhesive member ADP1 may include a first adhesive surface AS1 attached to the display module DM (e.g., the support panel SPP), and a second adhesive surface AS2 attached to the protective cover PC (e.g., the combine part CP). The adhesive member ADP1 may include a base layer, a first adhesive layer having the first adhesive surface AS1, and a second adhesive layer having the second adhesive surface AS2.

The first adhesive surface AS1 and the second adhesive surface AS2 may have different adhesive forces from each other. The first adhesive surface AS1 may have an adhesive force that is two to five times greater than that of the second adhesive surface AS2. For instance, the first adhesive surface AS1 may have an adhesive force of about 1000 gf/in, and the second adhesive surface AS2 may have an adhesive force of about 500 gf/in. The unit "gf/in" is defined by an intensity of force required to remove an adhesive tape with a width of about 1 inch.

As shown in FIG. 6A, the adhesive member ADP1 may be coupled to the support panel SPP and the protective cover PC is separated from the support panel SPP. In some embodiments where the first adhesive surface AS1 has an adhesive force smaller than that of the second adhesive surface AS2, the display module DM may be separated from the adhesive member ADP1 and the protective cover PC may remain adhered to the adhesive member ADP1. As shown in FIG. 6B, the adhesive member ADP1 may have a multi-layer structure. The adhesive member ADP1 in FIG. 6B is depicted as including two adhesive members as a representative example. A first adhesive member ASL1 may include a first adhesive surface ASL1-1 attached to the to the display module DM (e.g., the support panel SPP), and a second adhesive surface ASL1-2, and a second adhesive member ASL2 may include a third adhesive surface ASL2-1 and a fourth adhesive surface ASL2-2 attached to the protective cover PC (e.g., the combine part CP).

The adhesive surfaces of each of the first and second adhesive members ASL1 and ASL2 may have different adhesive forces from each other. The first adhesive surface ASL1-1 may have an adhesive force greater than that of the second adhesive surface ASL1-2, and the third adhesive surface ASL2-1 may have an adhesive force smaller than that of the fourth adhesive surface ASL2-2. In some embodiments, when the protective cover PC is removed or detached from the display module DM, the second adhesive member ASL2 may remain adhered to the protective cover PC while the first adhesive member ASL1 is separated from the protective cover PC, and the first adhesive member ASL1 may remain on the support panel SPP.

Figure 7A:
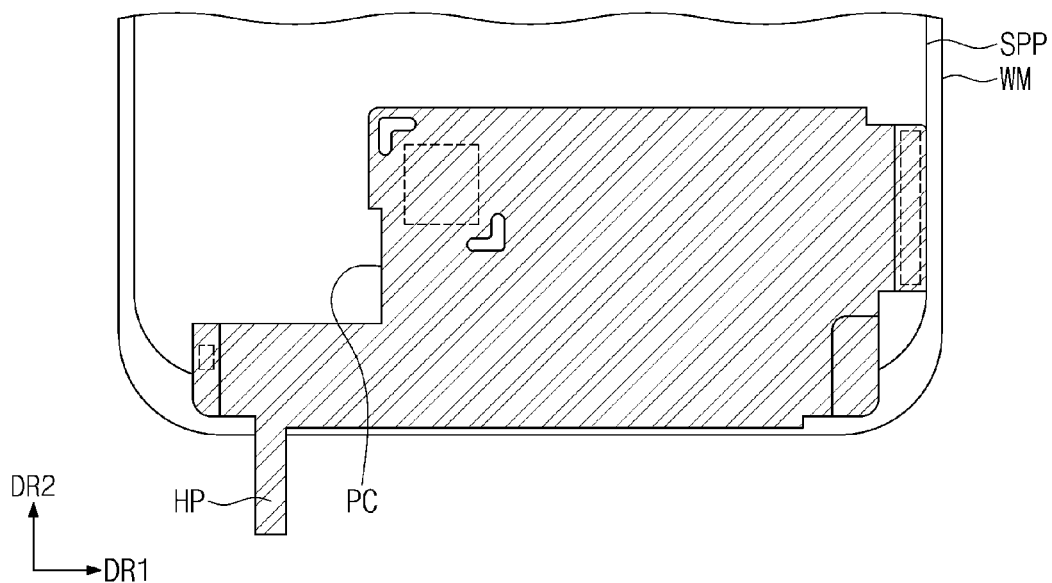
FIG. 7A is a plan view showing a portion of a display device according to some embodiments of the present disclosure.
Figure 7B:
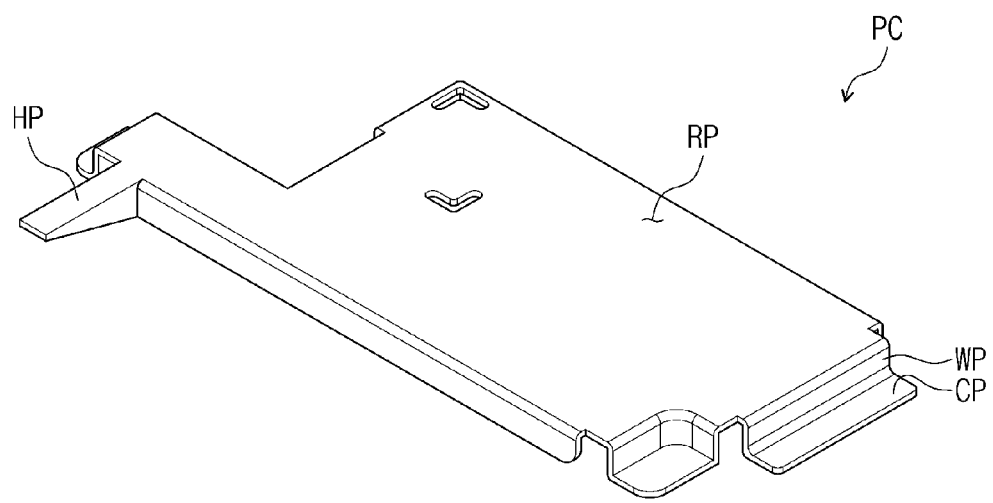
FIG. 7B is a perspective view showing a protective cover according to some embodiments of the present disclosure.

FIG. 7A is a plan view showing a portion of a display device DD according to some embodiments of the present disclosure. FIG. 7B is a perspective view showing a protective cover PC according to some embodiments of the present disclosure. In FIGS. 7A and 7B, detailed descriptions of the same elements as those of FIGS. 1 to 6B will be omitted.

As shown in FIGS. 7A and 7B, the protective cover PC according to some embodiments may further include a holding part HP. The holding part HP may extend from at least one of the roof part RP and the wall parts WP. When the protective cover PC is coupled to the display device DD, the holding part HP may protrude outward from the window member WM when viewed in a plan view.

When the protective cover PC is separated from the display device DD, an operator may easily separate the protective cover PC from the display device DD using the holding part HP. The holding part HP may be included in a protective cover PC with different shapes described later.

Figure 8A:
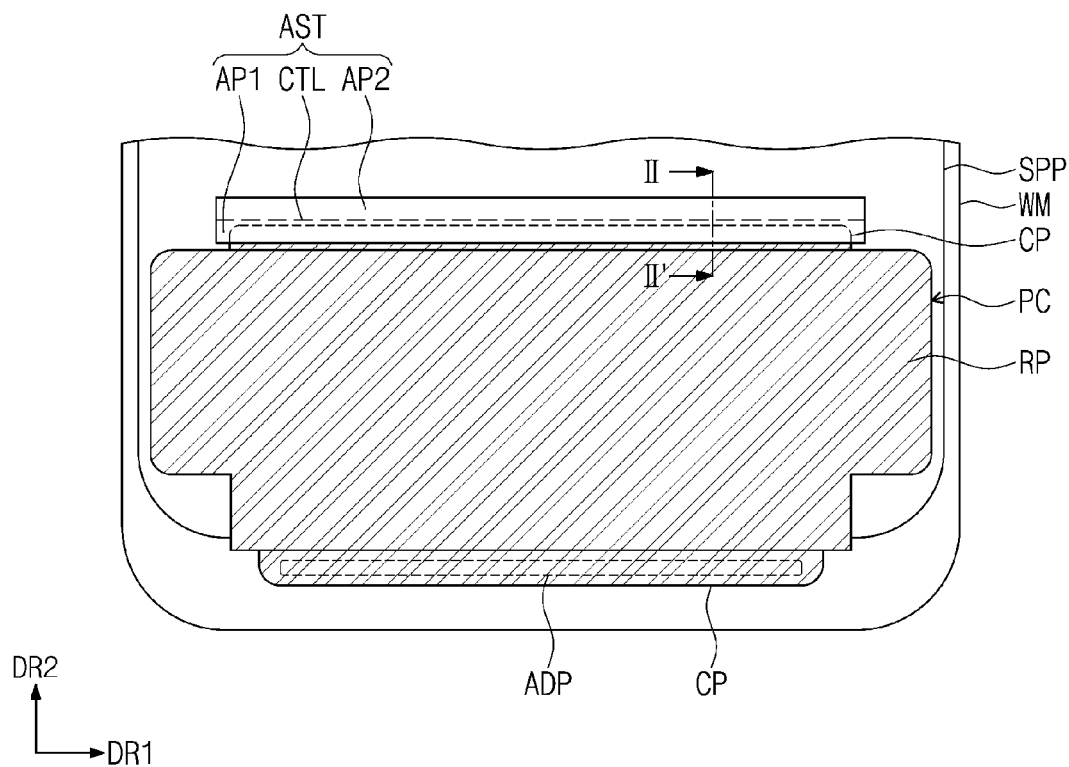
FIG. 8A is a plan view showing a portion of a display device according to some embodiments of the present disclosure.
Figure 8B:
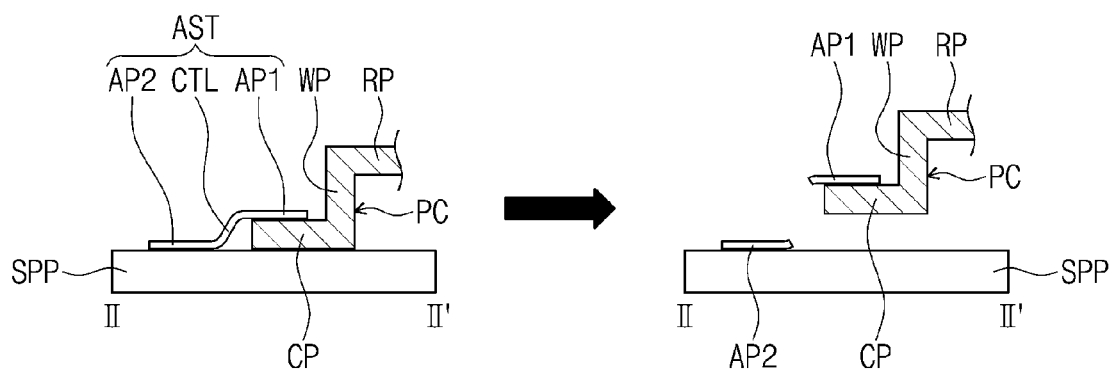
FIG. 8B is a cross-sectional view showing a portion of a display device according to some embodiments of the present disclosure.
Figure 8C:
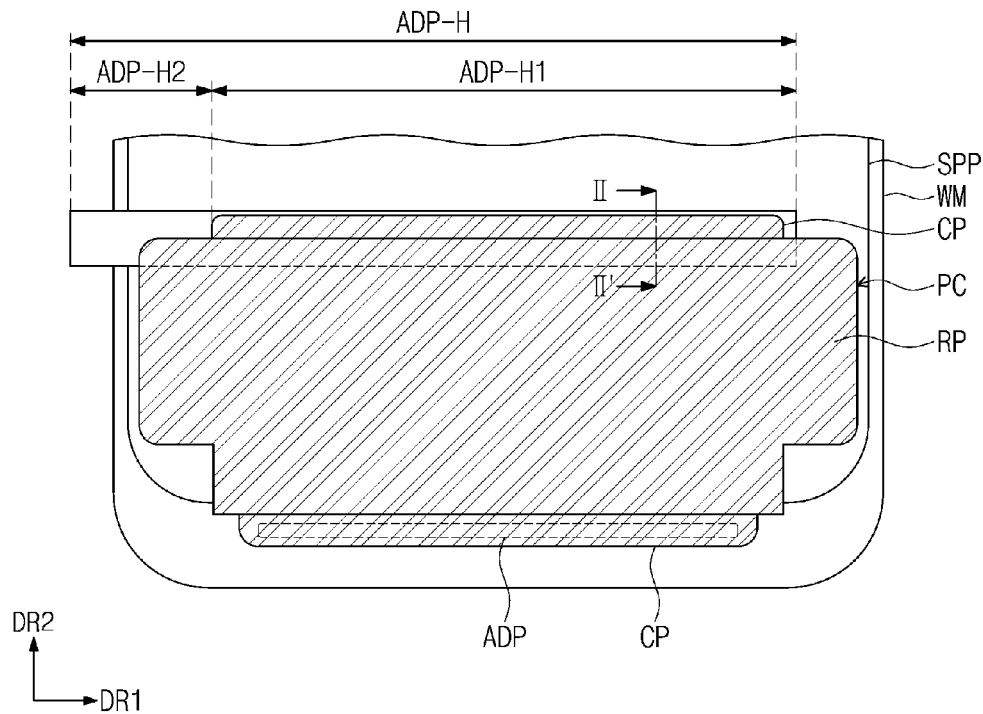
FIG. 8C is a plan view showing a portion of a display device according to some embodiments of the present disclosure.
Figure 8D:
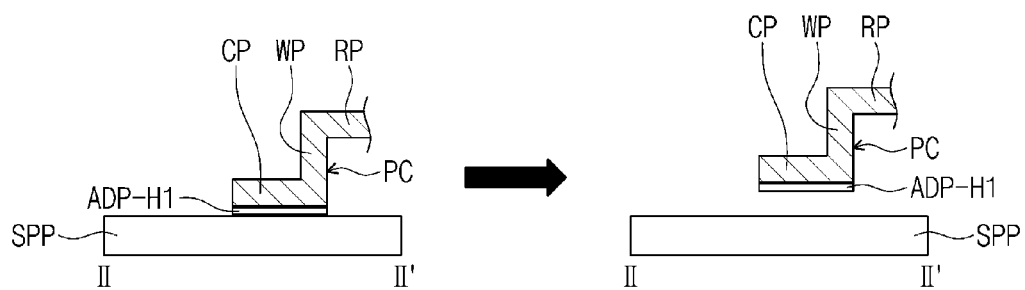
FIG. 8D is a cross-sectional view showing a portion of a display device according to some embodiments of the present disclosure.
Figure 8E:
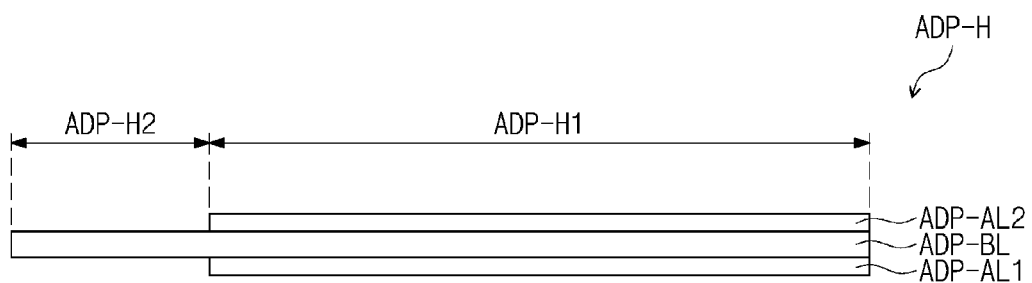
FIGS. 8E and 8F are cross-sectional views showing an adhesive member according to some embodiments of the present disclosure.
Figure 8F:
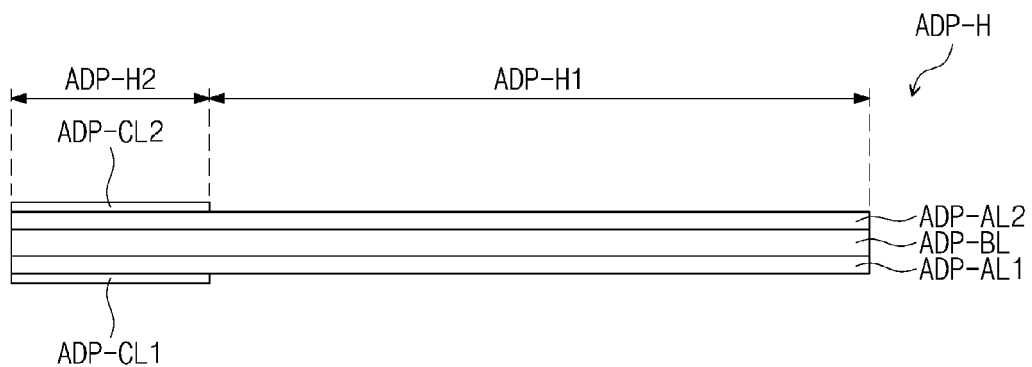
Figure 8G:
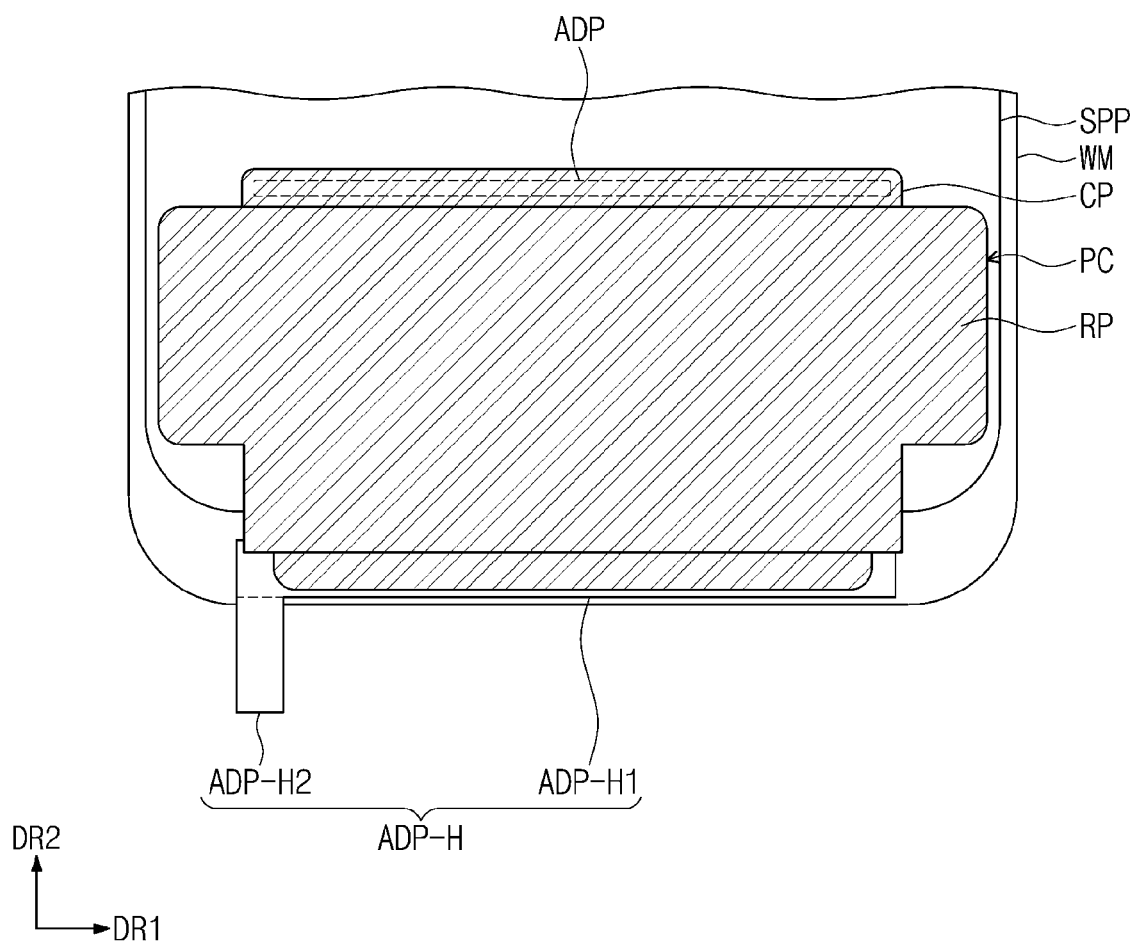
FIGS. 8G and 8H are plan views showing a portion of a display device according to some embodiments of the present disclosure.
Figure 8H:
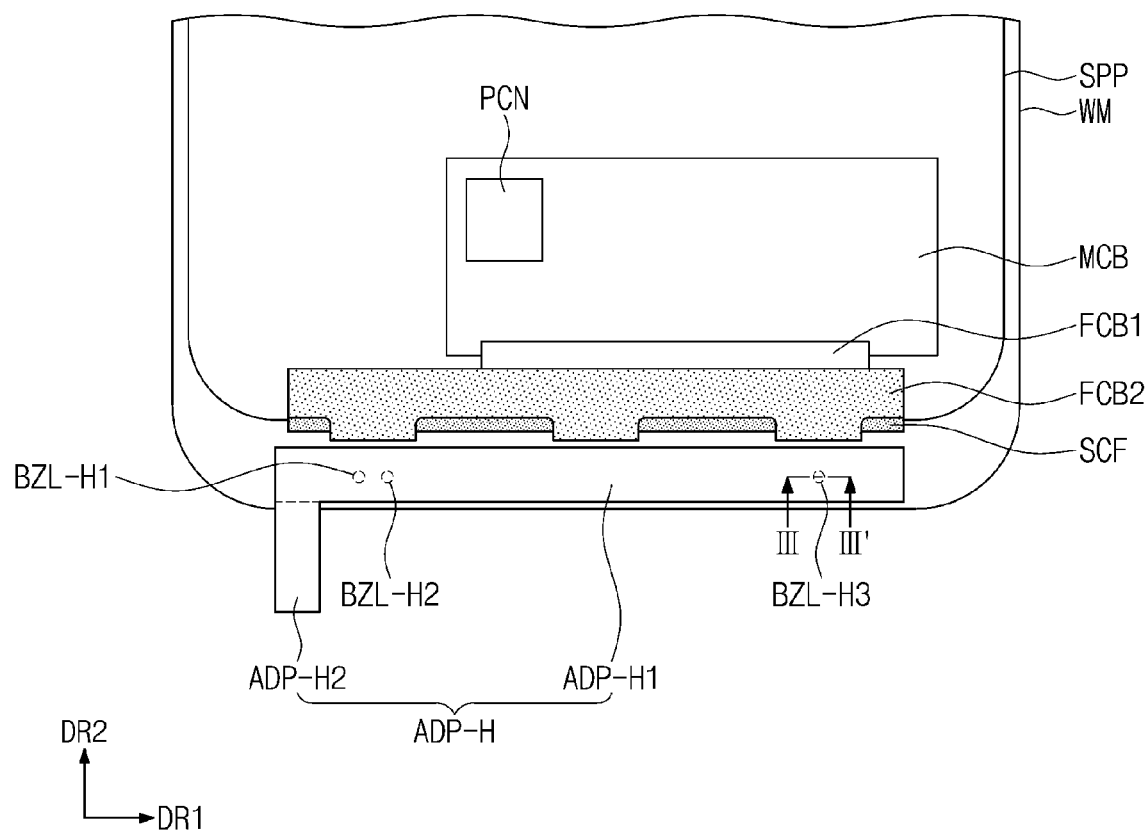
Figure 8I:
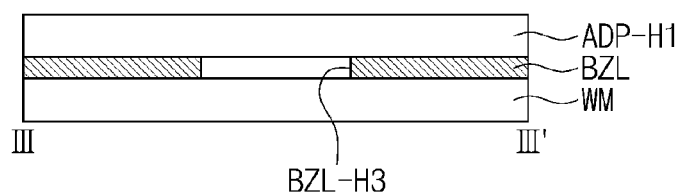
FIG. 8I is a cross-sectional view showing a portion of a display device according to some embodiments of the present disclosure.

FIG. 8A is a plan view showing a portion of a display device DD according to some embodiments of the present disclosure. FIG. 8B is a cross-sectional view showing a portion of a display device DD according to some embodiments of the present disclosure. FIG. 8C is a plan view showing a portion of a display device according to some embodiments of the present disclosure. FIG. 8D is a cross-sectional view showing a portion of a display device according to some embodiments of the present disclosure. FIGS. 8E and 8F are cross-sectional views showing an adhesive member according to some embodiments of the present disclosure. FIGS. 8G and 8H are plan views showing a portion of a display device according to some embodiments of the present disclosure. FIG. 8I is a cross-sectional view showing a portion of a display device according to some embodiments of the present disclosure.

FIG. 8B shows a cross-section taken along a line II-II' of FIG. 8A. FIG. 8D shows a cross-section taken along a line II-II' of FIG. 8C. In FIGS. 8A to 8I, detailed descriptions of the same elements as those of FIGS. 1 to 7B will be omitted.

The protective cover PC according to some embodiments may include a roof part RP, wall parts WP, and combine parts CP. However, the protective cover PC may have a different shape from that of the protective cover PC shown in FIGS. 6A and 6B. In some embodiments, the protective cover PC may include two combine parts CP facing each other in the second directional axis DR2.

The coupling structure according to some embodiments may further include an adhesive sheet AST (see FIGS. 8A and 8B). The adhesive sheet AST may include a first adhesive part AP1 attached to the protective cover PC (e.g., combine parts CP), a second adhesive part AP2 attached to the display module DM (e.g., the support panel SPP), and a cutting line CTL corresponding to a boundary between the first adhesive part AP1 and the second adhesive part AP2.

The cutting line CTL may include a pattern that allows the adhesive sheet AST to be easily cut by an external force. To that end, the cutting line CTL may be formed by alternately arranging openings and dotted patterns or as a relatively smaller thickness than other portions. The first adhesive part AP1 may be separated with the protective cover PC (e.g., the first adhesive part AP1 may remain adhered with the protective cover PC when the protective cover PC is removed or detached), and the second adhesive part AP2 may remain on the support panel SPP when the protective cover PC is removed or detached.

According to some embodiments of the present disclosure, when one combine part CP is coupled to the display module DM using an adhesive sheet AST (see FIGS. 8A and 8B), the other combine part of the two combine parts CP may be coupled to the display module DM by the same adhesive member ADP as described with reference to FIGS. 4A to 6B. Different from the above-mentioned embodiments, the adhesive member ADP may attach the window member WM and the combine part CP.

In some embodiments, the adhesive member ADP shown in FIG. 8A may be replaced with the adhesive sheet AST. According to some embodiments having an adhesive sheet AST, the adhesive sheet AST may be replaced with an adhesive member ADP. The adhesive member ADP that replaces the adhesive sheet AST may attach the combine part CP to the support panel SPP.

According to the display device DD shown in FIGS. 8C to 8F, the display device DD may include a holding adhesive member ADP-H different from the adhesive member ADP and the adhesive sheet AST. The holding adhesive member ADP-H may include a first part ADP-H1 overlapped with the protective cover PC (e.g., the combine part CP), and a second part ADP-H2 not overlapped with the combine part CP and partially protruding outward from the window member WM when viewed in a plan view.

For convenience of explanation, a width of the first part ADP-H1 is depicted as being slightly greater than that of the combine part CP (e.g., in the first direction DR1 as shown in FIG. 8C), but is not limited thereto or thereby.

In some embodiments of the present disclosure, the first part ADP-H1 may have the same structure as the adhesive member ADP1 described with reference to FIG. 6A. Accordingly, as shown in FIG. 8D, the holding adhesive member ADP-H may be removed or detached with the protective cover PC when the protective cover PC is removed or detached.

FIGS. 8E and 8F show cross-sections of the holding adhesive member ADP-H in the first direction DR1. As shown in FIGS. 8E and 8F, the first part ADP-H1 may have layers having adhesive surfaces with adhesive forces, and the second part ADP-H2 may omit layers having adhesive surfaces with adhesive forces. In some embodiments, both the first part ADP-H1 and the second part ADP-H2 of the adhesive member ADP may have layers having adhesive surfaces with adhesive forces.

As shown in FIGS. 8E and 8F, the first part ADP-H1 may include a base layer ADP-BL, a first adhesive layer ADP-AL1, and a second adhesive layer ADP-AL2. The first adhesive layer ADP-AL1 may provide a first adhesive surface AS1, and the second adhesive layer ADP-AL2 may provide a second adhesive surface AS2.

As shown in FIG. 8E, the second part ADP-H2 may include only the base layer ADP-BL. In some embodiments of the present disclosure, the second part ADP-H2 may have the same stack structure as that of the first part ADP-H1.

As shown in FIG. 8F, the first part ADP-H1 and the second part ADP-H2 may commonly include the base layer ADP-BL, the first adhesive layer ADP-AL1, and the second adhesive layer ADP-AL2. Cover layers ADP-CL1 and ADP-CL2 may be on the first adhesive layer ADP-AL1 and the second adhesive layer ADP-AL2 of the second part ADP-H2. The cover layers ADP-CL1 and ADP-CL2 may remove the adhesive force of the second part ADP-H2. The cover layers ADP-CL1 and ADP-CL2 may be a colored organic layer containing pigments or dyes. The cover layers ADP-CL1 and ADP-CL2 may be functional coating layers.

In some embodiments, the operator may easily separate the protective cover PC from the display device DD using the second part ADP-H2. Further, in some embodiments, when the protective cover PC is separated from the display device DD, the operator may easily connect the protective cover PC to the display device DD using the second part ADP-H2.

According to the display device DD shown in FIGS. 8G to 8I, the holding adhesive member ADP-H may cover first to third holes BZL-H1 to BZL-H3. Referring to FIGS. 8G and 8H, the holding adhesive member ADP-H may prevent foreign substances (e.g., dust) from infiltrating into the first to third holes BZL-H1 to BZL-H3. FIG. 8I shows a cross-section of the third hole BZL-H3 as a representative example.

In some embodiments of the present disclosure, the holding adhesive member ADP-H may be a protective film having an adhesive force on both surfaces thereof. In some embodiments, both surfaces of the protective film may have the same adhesive force. In some embodiments, the surface that makes contact with the combine part CP may have a relatively greater adhesive force than that of the surface that does not make contact with the combine part CP (e.g., the surface makes contact with the support panel SPP). In addition, the protective film may include a part that is not overlapped with the protective cover PC and that may not have adhesive forces.

Figure 9A:
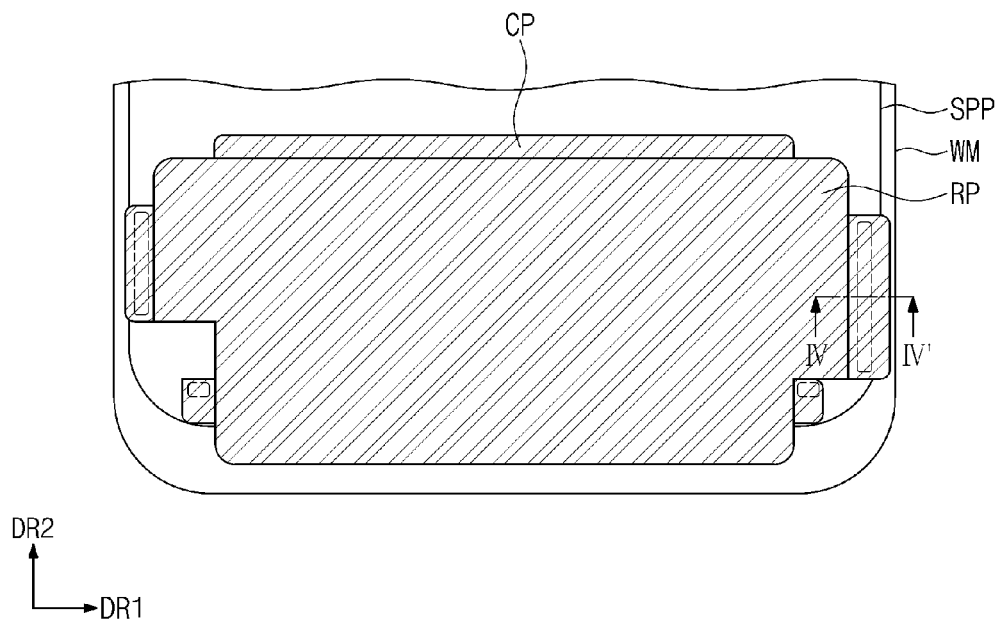
FIGS. 9A and 9B are plan views showing a portion of a display device according to some embodiments of the present disclosure.
Figure 9B:
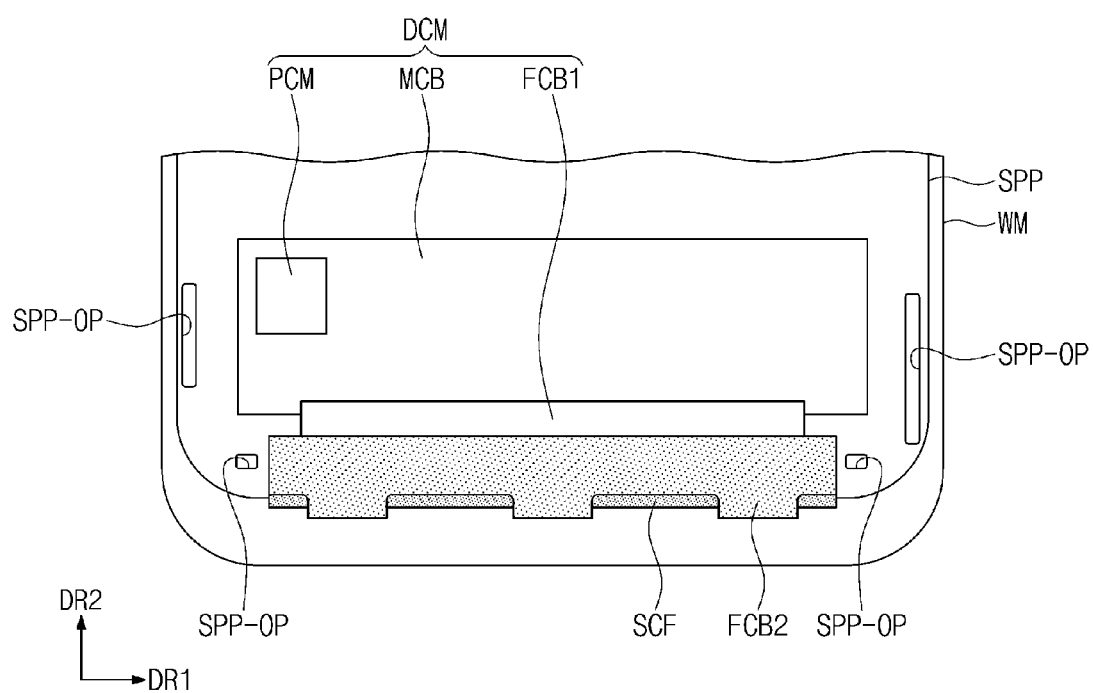
Figure 9C:
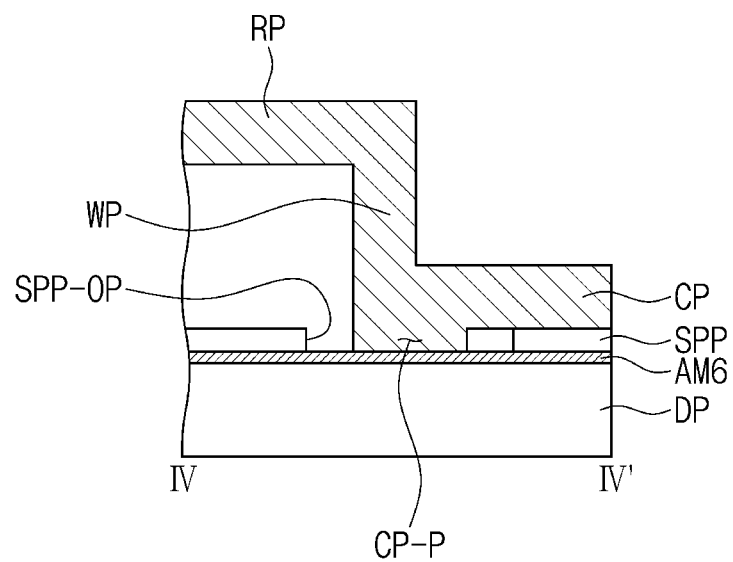
FIG. 9C is a cross-sectional view showing a coupling structure according to some embodiments of the present disclosure.

FIGS. 9A and 9B are plan views showing a portion of a display device DD according to some embodiments of the present disclosure. FIG. 9C is a cross-sectional view showing a coupling structure according to some embodiments of the present disclosure. FIG. 9B shows a cross-section taken along a line IV-IV' of FIG. 9A. In FIGS. 9A to 9C, detailed descriptions of the same elements as those of FIGS. 1 to 7B will be omitted.

As shown in FIG. 9B, the support panel SPP may include at least one opening SPP-OP to expose a portion of the sixth adhesive member AM6. FIG. 9B shows four openings SPP-OP as a representative example. In some embodiments, a portion of the sixth adhesive member AM6 exposed through the openings SPP-OP may be defined as the coupling structure that couples the display module DM to the protective cover PC.

A portion of the protective cover PC may be located in the openings SPP-OP and may be attached to the coupling structure (i.e., may be attached to the exposed portions of the sixth adhesive member AM6). Accordingly, in some embodiments, the protective cover PC may be coupled to the display module DM without using the adhesive member ADP1 and the adhesive sheet AST. As shown in FIG. 9C, protrusions CP-P protruding from a bottom surface of the combine parts CP may be inserted into the openings SPP-OP.

The display device DD according to some embodiments of the present disclosure may further include the adhesive member ADP1 and the adhesive sheet AST in addition to the coupling structure (e.g., the sixth adhesive member AM6).

Figure 10A:
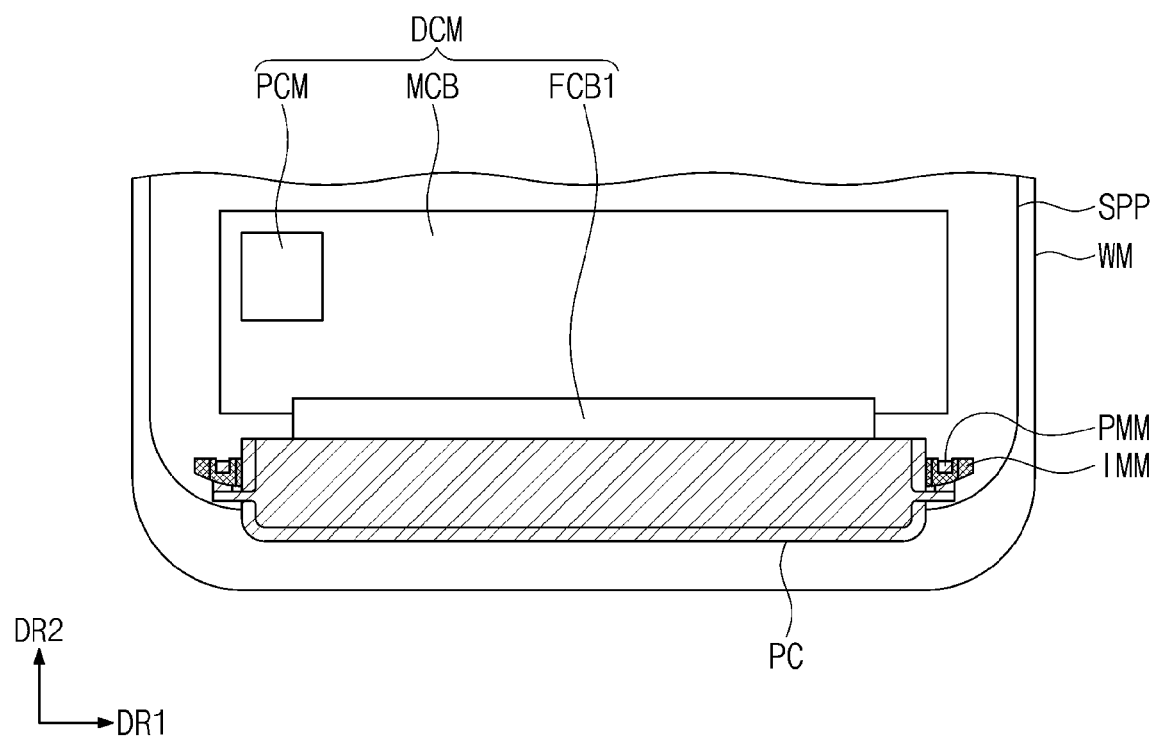
FIG. 10A is a plan view showing a portion of a display device according to some embodiments of the present disclosure.
Figure 10B:
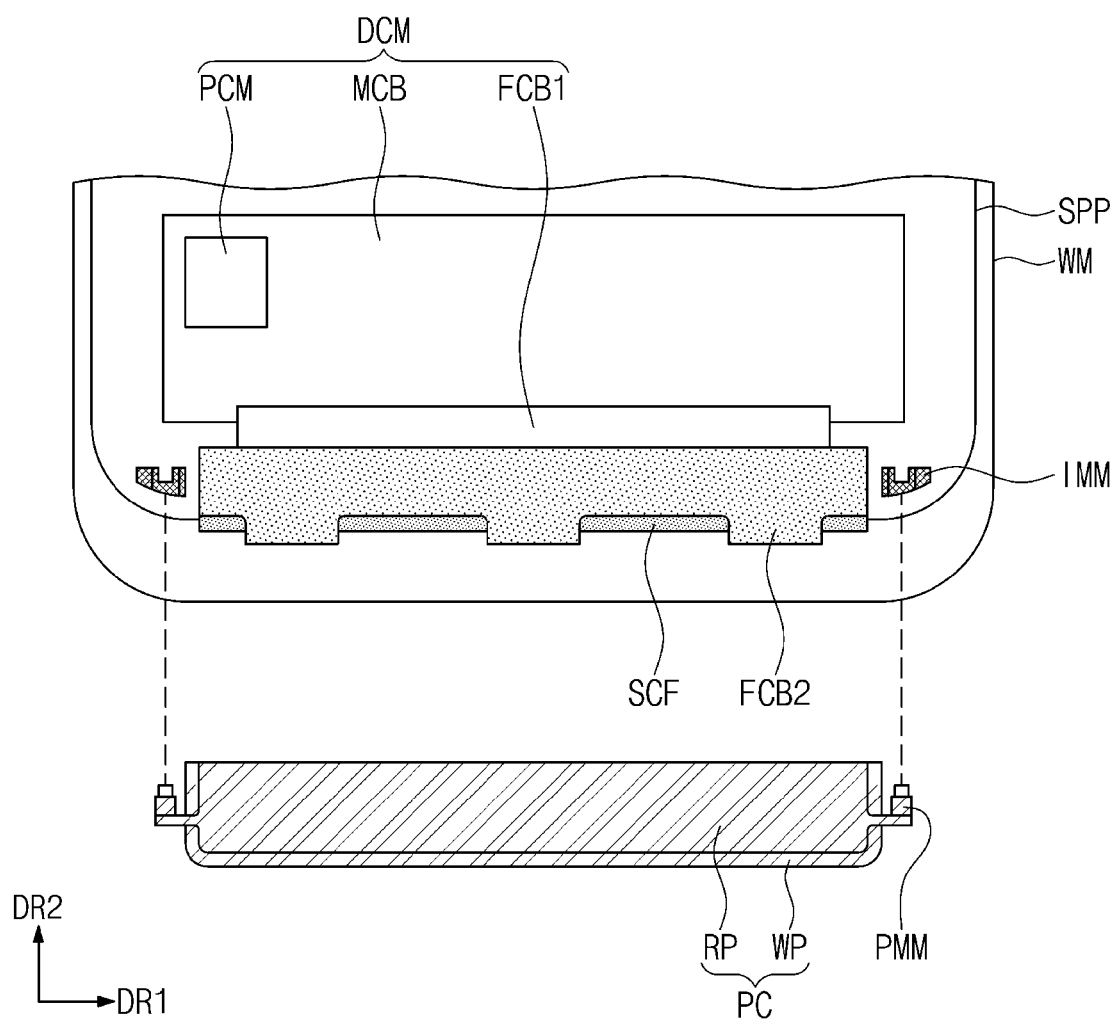
FIG. 10B is a plan view showing a portion of a display device according to some embodiments of the present disclosure.
Figure 10C:
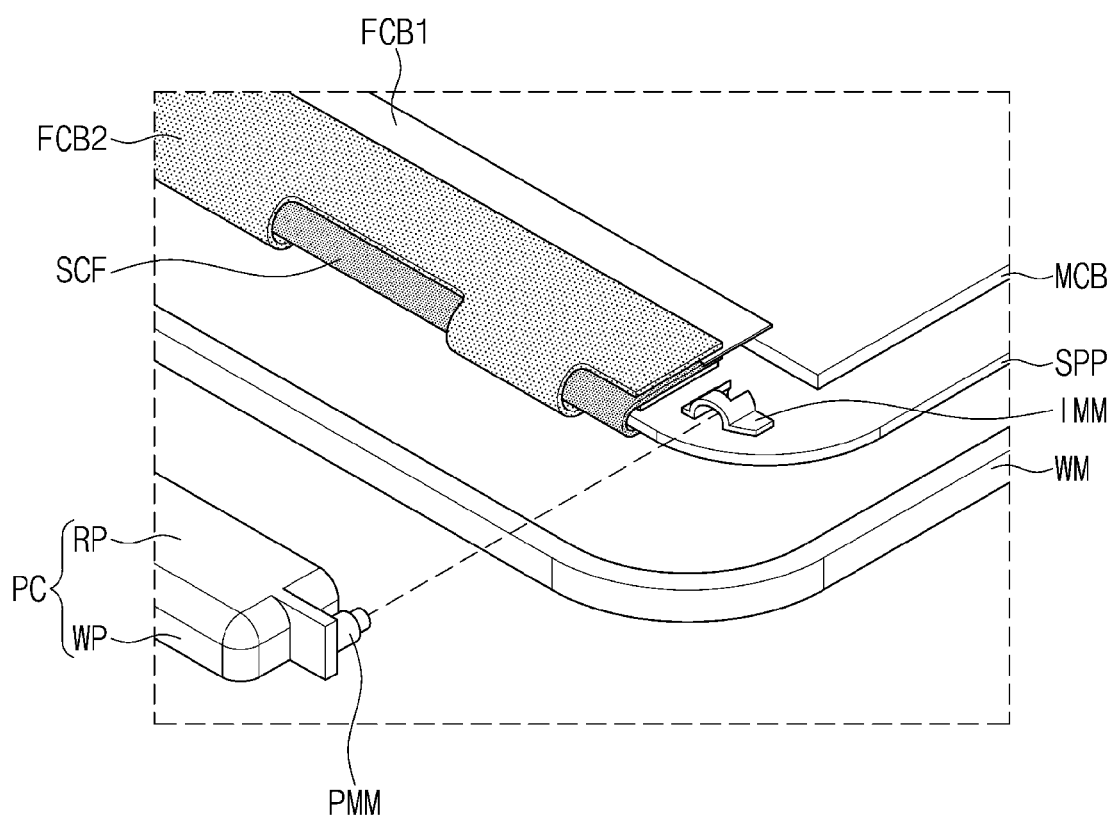
FIG. 10C is a perspective view showing a portion of a display device according to some embodiments of the present disclosure.
Figure 11A:
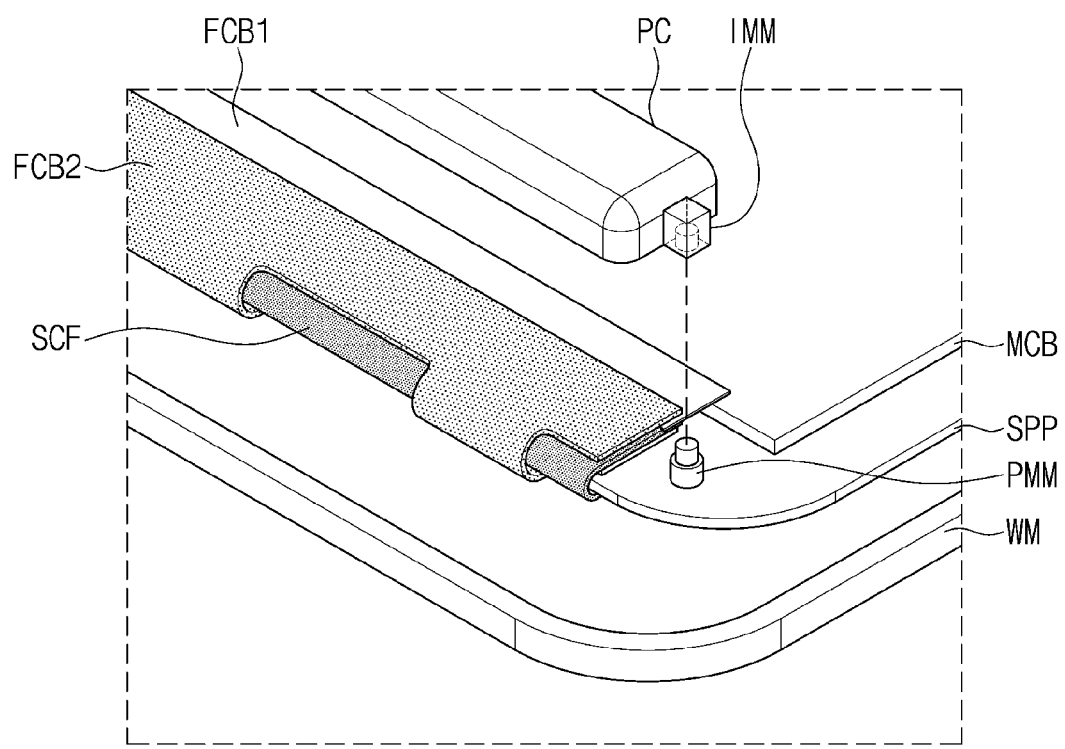
FIGS. 11A and 11B are perspective views showing a portion of a display device according to some embodiments of the present disclosure.
Figure 11B:
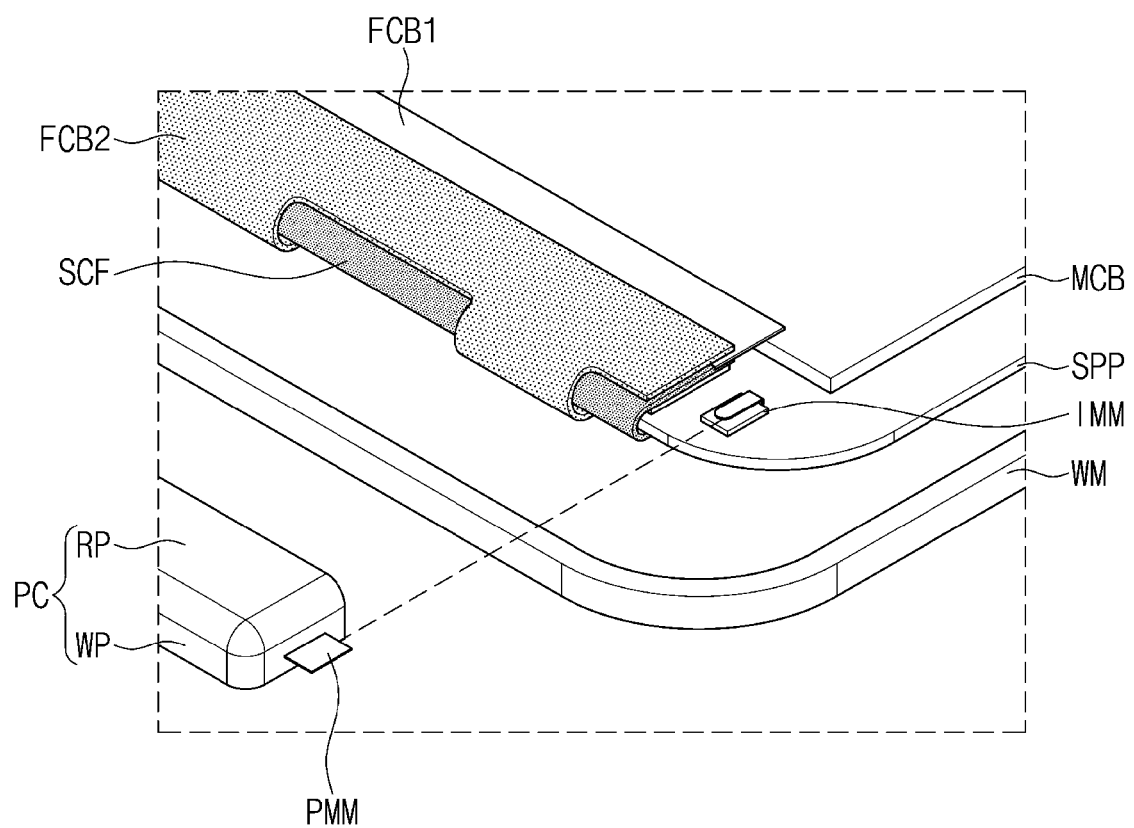

FIG. 10A is a plan view showing a portion of a display device according to some embodiments of the present disclosure. FIG. 10B is a plan view showing a portion of a display device according to some embodiments of the present disclosure. FIG. 10C is a perspective view showing a portion of a display device according to some embodiments of the present disclosure. FIGS. 11A and 11B are perspective views showing a portion of a display device according to some embodiments of the present disclosure.

In some embodiments, the protective cover PC may include a roof part RP and wall parts WP, and may have a different shape from that of the above-described protective cover PC.

As shown in FIGS. 10A to 11B, a coupling structure according to some embodiments includes a protrusion structure PMM and an insertion structure IMM that defines a coupling recess or a coupling hole into which the protrusion structure PMM is inserted. One of the protrusion structure PMM and the insertion structure IMM may be connected to the protective cover PC, and the other of the protrusion structure PMM and the insertion structure IMM may be connected to the display module. In FIGS. 10A to 10C, two coupling structures are depicted as a representative example, but the number of the coupling structures is not limited to two.

As shown in FIGS. 10A to 10C, the protrusion structure PMM may be connected to the protective cover PC, and the insertion structure IMM may be connected to the support panel SPP. The protrusion structure PMM may be integrally formed with the protective cover PC. The protrusion structure PMM may be integrally formed with the protective cover PC, for example, by a plastic molding method, but is not limited thereto or thereby.

The insertion structure IMM may be a plastic member or a metal member. The insertion structure IMM may be coupled to the support panel SPP by an adhesive. In some embodiments, a metal insertion structure IMM may be coupled to the support panel SPP by a soldering method. In some embodiments, an insertion structure IMM has a rounded shape and is coupled to a support panel SPP that has a tunnel shape to provide a corresponding coupling hole or opening (see FIG. 10C).

In some embodiments, the protrusion structure PMM and the insertion structure IMM may be hook-coupled to each other (e.g., coupled by interlocking parts) or may be coupled to each other by a frictional force between the protrusion structure PMM and the insertion structure IMM, which is generated when the protrusion structure PMM is forcibly inserted into the insertion structure IMM. In some embodiments, the coupling structure may further include an additional structure to improve a coupling stability while the protrusion structure PMM is coupled to the insertion structure IMM. The additional structure may be coupled to an end of the protrusion structure PMM protruding from the insertion structure IMM when the protrusion structure PMM is coupled to the insertion structure IMM. For instance, the additional structure may further include a nut into which the protrusion structure PMM is inserted and a fixing pin, screw, or bolt inserted into a thru-hole defined through the end exposed from the insertion structure IMM.

As shown in FIG. 11A, the insertion structure IMM may be coupled to the support panel SPP, and the insertion structure IMM may provide a coupling recess (e.g., for the protrusion structure PMM to be inserted into). In addition, the insertion structure IMM may have various structures/forms to which the protrusion structure PMM is coupled.

As shown in FIG. 11B, the protrusion structure PMM may be a plate connected to the protective cover PC, and the insertion structure IMM may be a clip coupled to the support panel SPP. The clip may be a metal or a plastic member that holds a plate inserted thereto using a restoring force caused by a shape thereof.

Figure 12A:
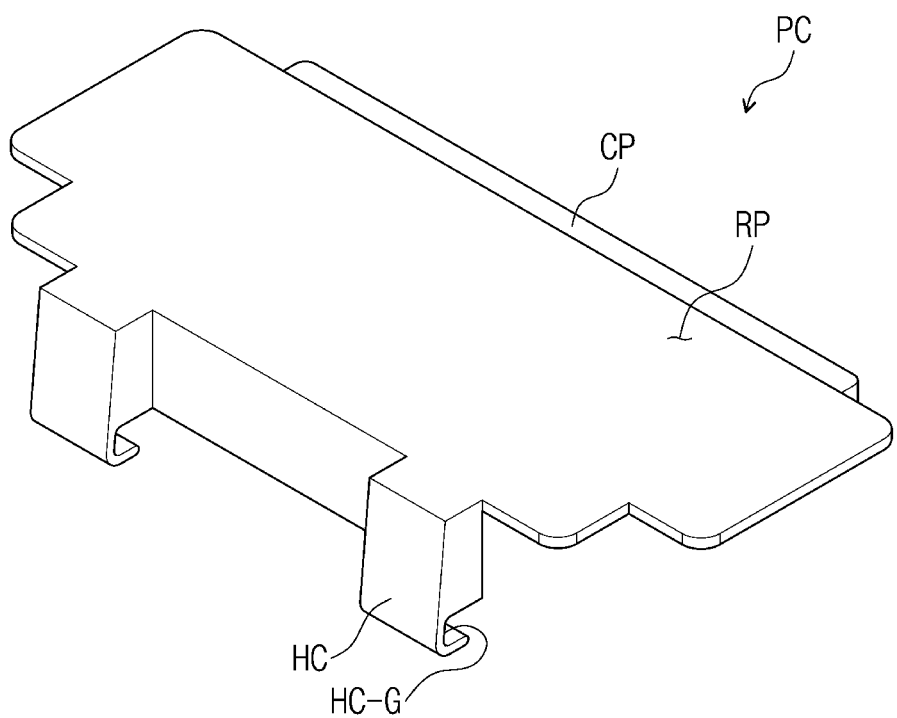
FIG. 12A is a perspective view showing a protective cover according to some embodiments of the present disclosure.
Figure 12B:
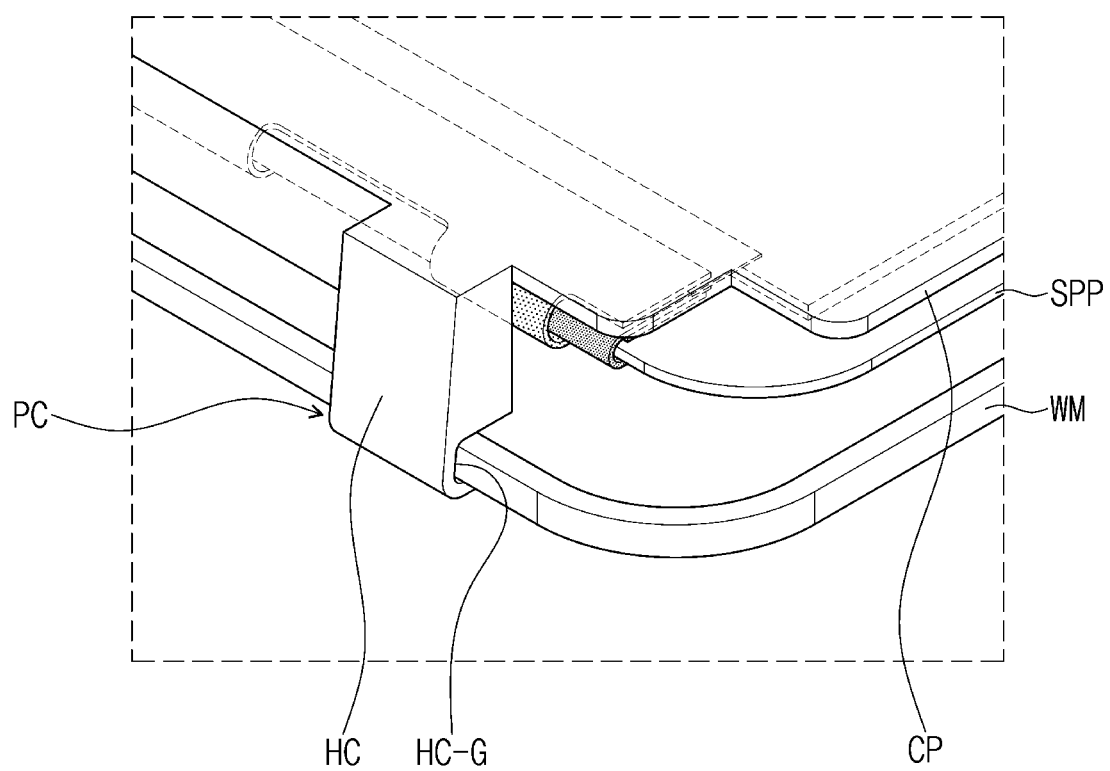
FIG. 12B is a perspective view showing a portion of a display device according to some embodiments of the present disclosure.

FIG. 12A is a perspective view showing a protective cover PC according to some embodiments of the present disclosure. FIG. 12B is a perspective view showing a portion of a display device DD according to some embodiments of the present disclosure.

Referring to FIGS. 12A and 12B, the protective cover PC according to some embodiments may further include a hook part HC. In FIGS. 12A and 12B, the protective cover PC includes two hook parts HC, but is not limited thereto or thereby.

The hook part HC may extend from a roof part RP and/or wall parts WP. The hook part HC may include a groove HC-G defined therein, and an edge of a window member WM may be inserted into the groove HC-G.

The hook part HC may replace an adhesive member. The hook part HC shown in FIG. 12A may be replaced with the adhesive member, and the protective cover PC may further include a holding part.

Figure 13:
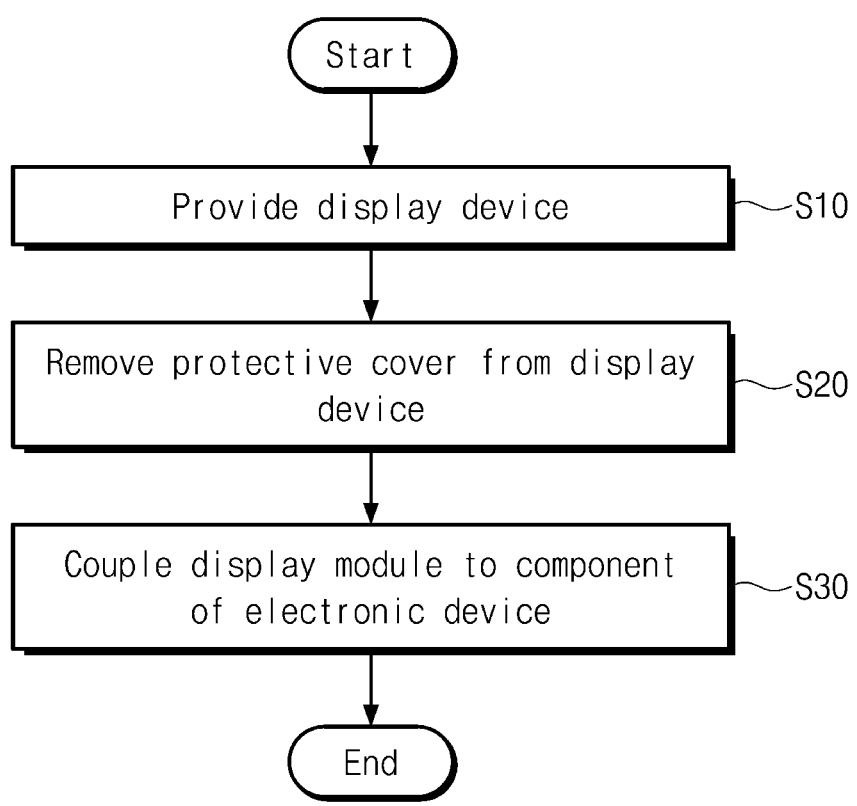
FIG. 13 is a flowchart showing a method of manufacturing an electronic device according to some embodiments of the present disclosure.

FIG. 13 is a flowchart showing a method of manufacturing an electronic device according to some embodiments of the present disclosure. In the following descriptions, the reference numerals refer to FIGS. 1 to 12B.

First, a display device DD may be provided (S10). The display device DD may be the display device DD described with reference to FIGS. 1 to 12B. The display device DD may include the display module DM, the protective cover PC, and the coupling structure. The coupling structure may include at least one of the coupling structures described with reference to FIGS. 4A to 12B. The display module DM may be protected by the protective cover PC during the transferring (e.g., assembly) of the display device DD to thus be provided without defects.

Then, the protective cover PC may be removed or detached from the display device DD (S20) (e.g., from the display module). In this case, all or a portion of the coupling structure may be removed or detached with protective cover PC when the protective cover PC is removed or detached. The operator may remove or detach the holding adhesive member ADP-H and the protective cover PC using the second part ADP-H2 shown in FIGS. 8C and 8G.

The adhesive member described with reference to FIGS. 4A to 6B may remain on (e.g., attached to) the display module DM when the protective cover PC is removed or detached. The insertion structure IMM or the protrusion structure PMM described with reference to FIGS. 10A to 11B may remain on (e.g., attached to) the display module DM when the protective cover PC is removed or detached.

Then, the display module DM may be coupled to the component of the electronic device (S30). The component of the electronic device may be the connector of the mother board electrically connected to the driving control module DCM of the display module DM. The component of the electronic device may include the bracket BRK or the external case EDC physically coupled to the display module DM.

The component of the electronic device may be physically coupled to the display module DM via the coupling structure remaining on the display module DM after the protective cover PC is removed or detached. The display module DM may be attached to the bracket BRK or the external case EDC using the adhesive member described with reference to FIGS. 4A to 6B. The bracket BRK or the external case EDC may include the protrusion structure or the insertion structure that is coupled to the insertion structure IMM or the protrusion structure PMM, which remains on the display module DM described with reference to FIGS. 10A to 11B.

The display module DM is coupled to the bracket BRK or the external case EDC using the coupling structure after the protective cover PC is removed or detached, and thus manufacturing costs may be reduced. In addition, additional structures that couple the display module DM to the bracket BRK or the external case EDC may be applied to manufacture the electronic device.

Although the exemplary embodiments of the present invention have been described, it is understood that the present invention should not be limited to these exemplary embodiments but various changes and modifications can be made by one ordinary skilled in the art within the spirit and scope of the present invention as hereinafter claimed.

Therefore, the disclosed subject matter should not be limited to any single embodiment described herein, and the above-described embodiments are to be considered illustrative and not restrictive. Accordingly, the scope of the present inventive concept shall be determined only according to the attached claims, and equivalents thereof.

What is claimed is:

1. A display device comprising:
a window member;
a display module comprising a non-bending area overlapped with a display area of the window member, a curvature area bent from the non-bending area, and a pad area extending from the curvature area, facing the non-bending area, and spaced apart from the non-bending area, wherein the non-bending area comprises a front surface facing the window member and a rear surface;
a flexible circuit board being connected to the pad area of the display module;
a protective cover disposed on a rear surface of the window member and covering the curvature area of the display module and the flexible circuit board, wherein at least a portion of the flexible circuit board faces the protective cover; and
a coupling structure coupling the display module to the protective cover.

2. The display device of claim 1, wherein the coupling structure comprises a first adhesive member comprising a first adhesive surface attached to the display module and a second adhesive surface attached to the protective cover.

3. The display device of claim 2, wherein the first adhesive member comprises a first part overlapped with the protective cover and a second part extending from the first part and protruding outward from the window member when viewed in a plan view.

4. The display device of claim 3, wherein the first part comprises a base layer and first and second adhesive layers respectively on front and rear surfaces of the base layer, and the second part comprises a base layer integrally formed with the base layer of the first part.

5. The display device of claim 3, wherein each of the first part and the second part comprises a base layer and first and second adhesive layers respectively on front and rear surfaces of the base layer, and the second part further comprises cover layers respectively on the first adhesive layer and the second adhesive layer.

6. The display device of claim 3, wherein the window member comprises a base member and a bezel layer on a rear surface of the base member, the bezel layer comprises at least one hole defined therethrough, and the first adhesive member covers the at least one hole of the bezel layer.

7. The display device of claim 2, wherein the protective cover comprises:
a roof part spaced apart from the rear surface of the display module to face the rear surface of the display module;
wall parts bent from the roof part; and
combine parts bent from at least a portion of the wall parts to face the rear surface of the display module,
wherein the first adhesive member attaches one of said combine parts to the rear surface of the display module.

8. The display device of claim 7, wherein the protective cover further comprises a holding part connected to at least one of the roof part and the wall parts, and the holding part protrudes outward from the window member when viewed in a plan view.

9. The display device of claim 2, wherein the first adhesive surface has an adhesive force greater than an adhesive force of the second adhesive surface.

10. The display device of claim 2, wherein the first adhesive member comprises a first adhesive layer comprising the first adhesive surface, a second adhesive layer attached to the first adhesive layer comprises the second adhesive surface, and an adhesive force of each of the first and second adhesive surfaces is greater than each of an adhesive force of an inner adhesive surface of the first adhesive layer and an adhesive force of an inner adhesive surface of the second adhesive layer, wherein the inner adhesive surface of the second adhesive layer is attached to the inner adhesive surface of the first adhesive layer.

11. The display device of claim 1, wherein the coupling structure comprises an adhesive sheet comprising a first adhesive part attached to the protective cover, a second adhesive part attached to the display module, and a cutting line defining a boundary between the first adhesive part and the second adhesive part.

12. The display device of claim 1, wherein the protective cover comprises a hook part coupled to an edge of the window member, the hook part comprising a groove defined therein, and wherein the edge of the window member is configured to be inserted into the groove.

13. The display device of claim 1,
wherein the display module comprises:
a display panel on the rear surface of the window member;
a touch sensing unit located between the window member and the display panel; and
a support panel on the rear surface of the non-bending area.

14. The display device of claim 13, wherein the display module further comprises an adhesive member to couple the rear surface of the display panel and the support panel, the support panel comprising at least one opening formed therethrough to expose a portion of the adhesive member, wherein the coupling structure comprises the portion of the exposed adhesive member, and a portion of the protective cover is located in the at least one opening of the support panel and attached to the coupling structure.

15. The display device of claim 13, wherein the display panel comprises:
- a base layer located in the non-bending area and the curvature area;
- a circuit layer on a front surface of the base layer and located in the non-bending area and the curvature area;
- an element layer on a front surface of the circuit layer to overlap with the non-bending area;
- an encapsulation layer on the element layer; and
- a protective film on a rear surface of the base layer.

16. The display device of claim 15,
wherein the protective film is located in the non-bending area and the pad area and not in the curvature area.

17. The display device of claim 16, further comprising a stress control film on a front surface of the display panel in the curvature area and not overlapped with the display area of the window member.

18. The display device of claim 1, wherein the coupling structure comprises a protrusion structure and an insertion structure defining a coupling recess or a coupling hole into which the protrusion structure is inserted, wherein one of the protrusion structure and the insertion structure is connected to the protective cover, and the other of the protrusion structure and the insertion structure is connected to the display module.

19. A display device comprising:
- a window member;
- a display module comprising a non-bending area overlapped with a display area of the window member and a bending area bent from the non-bending area, wherein the non-bending area comprises a front surface facing the window member and a rear surface;
- a driving control module on the rear surface of the non-bending area and connected to the bending area of the display module;
- a protective cover on a rear surface of the window member to cover the bending area of the display module and the driving control module, wherein at least a portion of the driving control module faces the protective cover; and
- a coupling structure coupling the display module to the protective cover.

20. The display device of claim 19, wherein the driving control module comprises:
- a main circuit board;
- a flexible circuit board connecting the main circuit board to the display module; and
- a protective can coupled to the main circuit board to cover electronic parts mounted on the main circuit board, and wherein the coupling structure further comprises a second adhesive member attaching the protective can to the protective cover.

* * * * *